(12) United States Patent
Okamoto et al.

(10) Patent No.: US 8,017,932 B2
(45) Date of Patent: Sep. 13, 2011

(54) LIGHT-EMITTING DEVICE

(75) Inventors: Kuniyoshi Okamoto, Kyoto (JP); Hiroaki Ohta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 193 days.

(21) Appl. No.: 12/443,247

(22) PCT Filed: Sep. 21, 2007

(86) PCT No.: PCT/JP2007/068398
§ 371 (c)(1), (2), (4) Date: Mar. 27, 2009

(87) PCT Pub. No.: WO2008/041521
PCT Pub. Date: Apr. 10, 2008

(65) Prior Publication Data
US 2010/0096615 A1     Apr. 22, 2010

(30) Foreign Application Priority Data

Sep. 29, 2006 (JP) .................................. 2006-268709
Feb. 20, 2007 (JP) .................................. 2007-040073

(51) Int. Cl.
*H01L 33/00* (2010.01)

(52) U.S. Cl. ........................................................ 257/13

(58) Field of Classification Search ..................... 257/13
See application file for complete search history.

(56) References Cited

U.S. PATENT DOCUMENTS

| 6,967,981 | B2 * | 11/2005 | Chua et al. ................. 372/46.01 |
| 2002/0079498 | A1 | 6/2002 | Koide |
| 2004/0238810 | A1 * | 12/2004 | Dwilinski et al. ............... 257/12 |
| 2005/0133796 | A1 * | 6/2005 | Seo et al. ......................... 257/79 |
| 2005/0214992 | A1 * | 9/2005 | Chakraborty et al. ........ 438/172 |
| 2005/0224783 | A1 * | 10/2005 | Matsuyama et al. ............ 257/14 |
| 2007/0037308 | A1 * | 2/2007 | Okuyama et al. ............... 438/46 |
| 2008/0179607 | A1 * | 7/2008 | DenBaars et al. ................ 257/94 |

FOREIGN PATENT DOCUMENTS

JP   2000-216497   8/2000

OTHER PUBLICATIONS

Arpan Chakraborty et al.; Nonpolar InGaN/GaN emitters on reduced-defect lateral epitaxially overgrown a-plane GaN with drive-current-independent electroluminescence emission peak; Applied Physics Letters; Nov. 29, 2004; vol. 85, No. 22, pp. 5143-5145.

(Continued)

*Primary Examiner* — N Drew Richards
*Assistant Examiner* — Robert Carpenter
(74) *Attorney, Agent, or Firm* — Rabin & Berdo, PC

(57) ABSTRACT

A light-emitting device includes a group III nitride semiconductor layer of a multilayer structure consisting of a group III nitride semiconductor having a major surface defined by a nonpolar plane or a semipolar plane and having at least an n-type layer and a p-type layer. A surface of the group III nitride semiconductor layer on a light extraction side is a mirror surface. The light-emitting device may further include a transparent electrode in contact with the surface of the group III nitride semiconductor layer on the light extraction side. In this case, a surface of the transparent electrode on the light extraction side is preferably a mirror surface.

9 Claims, 11 Drawing Sheets

OTHER PUBLICATIONS

R. Sharma et al., Demonstration of a semipolar (1013) InGaN/GaN green light emitting diode, Applied Physics Letter; 2005, vol. 87, No. 23, pp. 231110-1-231110-3.

Gail Purvis; Changing the crystal face of gallium nitride; Technical Development; III-Vs Review, Nov. 2005, vol. 18, No. 8, pp. 26-28.

Hisashi Masui et al., Polarized Light Emission from Nonpolar InGaN Light-Emitting Diodes Grown on a Bulk m-Plane GaN Substrate, Japan Journal of Applid Physics, 2005, vol. 44, No. 43, pp. L1329-L1332.

Mitsuru Funato et al., Blue, Green, and Amber InGaN/GaN Light-Emitting Diodes on Semipolar {1122} GaN Bulk Substrate, Japan Journal of Applid Physics, 2006, vol. 45, No. 26, pp. L659-L662.

Kuniyoshi Okamoto et al., Dislocation-Free m-Plane InGaN/GaN Light-Emitting Diodes on m-Plane GaN Single Crystals, Japan Journal of Applid Physics, Nov. 2006, vol. 45, No. 45, pp. L1197-L1199.

Arpan Chakraborty et al., Denomstration of Nonpolar m-Plane InGaN/GaN Light-Emitters Diodes on Free-Sttanding m-Plane GaN Substrates; Japan Journal of Applid Physics, 2005, vol. 44, No. 5, pp. L173-L175.

Tetsuya Takeuchi et al., Theoretical Study of Orientation Dependence of Piezoelectric Effects in Wurtzite Strained GaInN/GaN Heterostructures and Quantum Wells; Japan Journal of Applied Physics; Feb. 2000; vol. 39, pp. 413-416.

* cited by examiner

FIG. 2
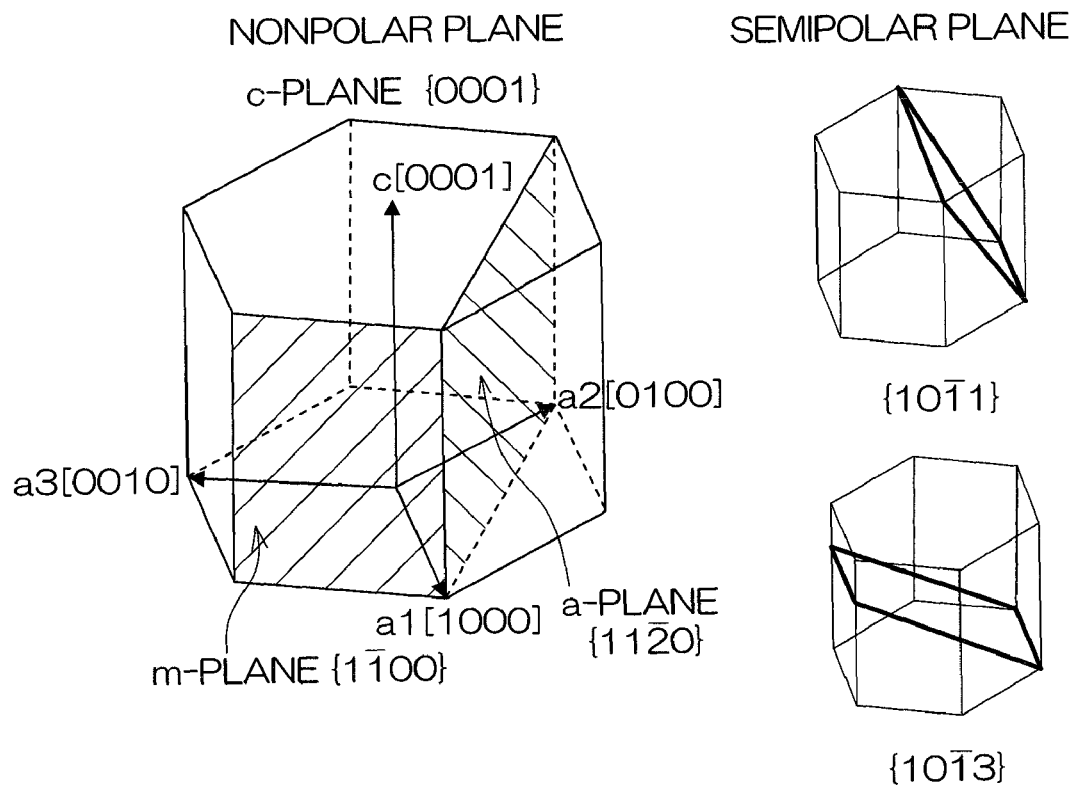
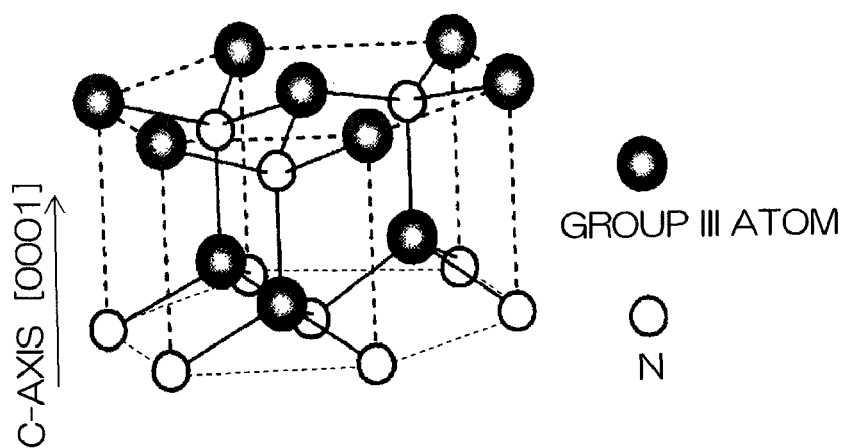

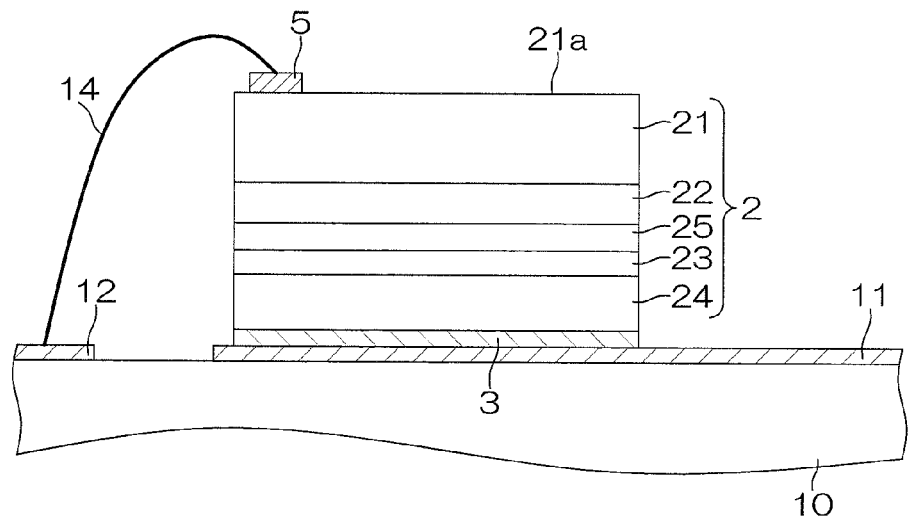
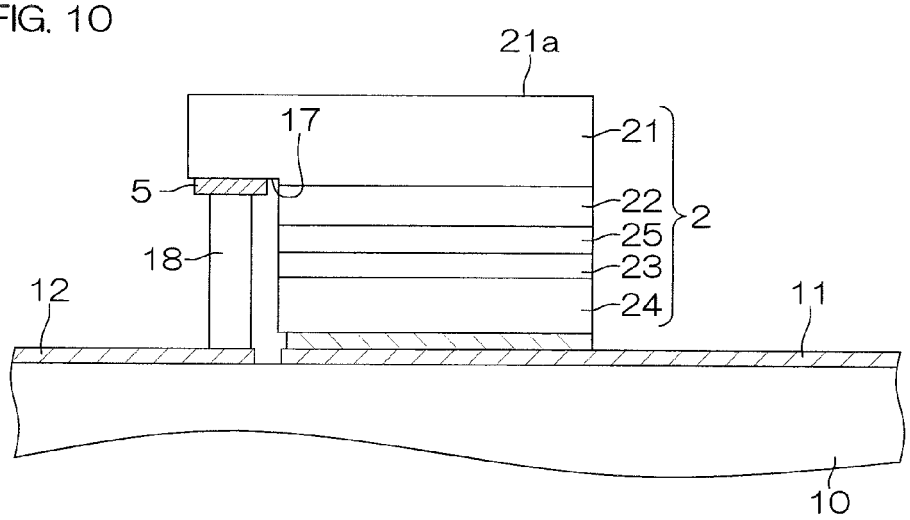

LIGHT-EMITTING DEVICE

TECHNICAL FIELD

The present invention relates to a light-emitting device (a light-emitting diode, a laser diode or the like) employing a group III nitride semiconductor.

PRIOR ART

A group III nitride semiconductor is a group III-V semiconductor employing nitrogen as a group V element. Typical examples of the group III nitride semiconductor include aluminum nitride (AlN), gallium nitride (GaN) and indium nitride (InN). The group III nitride semiconductor can be generally expressed as $Al_xIn_yGa_{1-x-y}N$ ($0 \leq x \leq 1$, $0 \leq y \leq 1$ and $0 \leq x+y \leq 1$), and is hereinafter referred to as a "gallium nitride semiconductor" or a "GaN semiconductor".

A method of manufacturing a nitride semiconductor by growing a group III nitride semiconductor on a gallium nitride (GaN) substrate having a major surface defined by a c-plane by metal organic chemical vapor deposition (MOCVD) is known. A GaN semiconductor multilayer structure having an n-type layer and a p-type layer can be formed by applying the method, and a light-emitting device utilizing the multilayer structure can be prepared. Such a light-emitting device can be utilized as the light source of a backlight for a liquid crystal panel, for example.

The major surface of a GaN semiconductor regrown on the GaN substrate having the major surface is defined by a c-plane. Light extracted from the c-plane is in a random polarization (non-polarization) state. When the light is incident on the liquid crystal panel, therefore, light other than specific polarized light corresponding to a polarization plate on an incidence side is blocked, and does not contribute to brightness to an outgoing side. Therefore, bright display is disadvantageously hard to implement (efficiency is 50% at the maximum).

In order to solve the problem, a technique of preparing a light-emitting device by growing a GaN semiconductor having a major surface defined by a plane other than a c-plane, i.e., a nonpolar plane such as an a-plane or an m-plane or a semipolar plane is examined. When a light-emitting device having a p-type layer and an n-type layer is formed by a GaN semiconductor layer having a major surface defined by a nonpolar plane or a semipolar plane, light of a strong polarization state can be emitted. Therefore, loss on a polarization plate on an incidence side can be reduced by matching the direction of polarization of such a light-emitting device and the direction of passage polarization of the polarization plate of a liquid crystal panel on the incidence side. Consequently, bright display can be implemented.

Non-Patent Document: T. Takeuchi et al., Jap. J. Appl. Phys. 39, 413-416, 2000

Non-Patent Document 2: A. Chakraborty, B. A. Haskell, H. S. Keller, J. S. Speck, S. P. DenBaars, S, Nakamura and U. K. Mishra: Jap. J. Appl. Phys. 44 (2005) L173

DISCLOSURE OF THE INVENTION

Problems to be Solved

In a light-emitting diode, on the other hand, a technique of scattering light by working a surface of a semiconductor layer on a light extraction side or a surface of an electrode on the light extraction side into a rough surface (sandblasted surface) has been employed in general.

When a GaN semiconductor layer having a major surface defined by a nonpolar plane or a semipolar plane is employed to emit polarized light, however, the polarized light is disturbed by irregularities of a rough surface if a surface of the GaN semiconductor layer on a light extraction side or a surface of an electrode on the light extraction side is the rough surface. When applied to a liquid crystal panel, therefore, loss on a polarization plate on an incidence side is increased, and improvement in energy efficiency and display brightness is hindered.

Needless to say, a similar problem is common not only to a light-emitting device employing a GaN semiconductor but also to a light-emitting device employing another group III nitride semiconductor.

Accordingly, an object of the present invention is to provide a light-emitting device employing a group III nitride semiconductor, capable of extracting light of an excellent polarization state.

Solutions to the Problems

A light-emitting device according to an aspect of the present invention includes a group III nitride semiconductor layer of a multilayer structure consisting of a group III nitride semiconductor having a major surface defined by a nonpolar plane or a semipolar plane and having at least an n-type layer and a p-type layer, and a surface of the group III nitride semiconductor layer on a light extraction side is a mirror surface.

According to the structure, the major surface of the group III nitride semiconductor layer is defined by a nonpolar plane or a semipolar plane, whereby light having large polarization is emitted. The surface of the group III nitride semiconductor layer on the light extraction side is a mirror surface, whereby the emitted light can be extracted outward in a hardly disturbed polarization state.

When the light-emitting device is applied to a light source of a liquid crystal display panel, therefore, the ratio of light not contributing to brightness is reduced, whereby energy efficiency can be improved, and display brightness can also be improved.

In order to work the surface of the group III nitride semiconductor layer on the light extraction side into a mirror surface, a method of performing polishing such as chemical mechanical polishing on the surface on the light extraction side or a method of growing a crystal of a gallium nitride semiconductor as a group III nitride semiconductor having a major growth surface formed by a mirror surface on a gallium nitride monocrystalline substrate having a major surface defined by a nonpolar plane or a semipolar plane by metal organic chemical vapor deposition can be applied. In this case, the gallium nitride semiconductor is preferably grown (preferably by not less than 0.1 μm) by metal organic chemical vapor deposition on the surface of the gallium nitride monocrystalline substrate (preferably without interposing a buffer layer) by employing such a condition that a V/III ratio indicating the ratio (molar ratio) of a nitrogen material to a group III element material (more specifically, a gallium material) is not less than 1000 (not less than 3000, for example) (preferably, without employing such a condition that the V/III ratio is less than 1000). According to the method, a (generally dislocation-free) gallium nitride semiconductor layer having an extremely small number of dislocations can be grown, whereby strongly polarized light can be extracted, while the gallium nitride semiconductor has excellent crystallinity, whereby high external quantum efficiency can be implemented.

In the growth of the gallium nitride semiconductor layer, the temperature of the gallium nitride monocrystalline substrate is preferably increased to 1000° C. to 1100° C. while feeding at least nitrogen source gas to the gallium nitride monocrystalline substrate. Thus, subsequent gallium nitride semiconductor crystal growth can be performed while suppressing roughening of the substrate surface.

Preferably, the major surface of the gallium nitride monocrystalline substrate is defined by a nonpolar plane or a semipolar plane, and is a surface having an offset angle of within ±1° from each surface orientation. Thus, a dislocation-free and planar gallium nitride semiconductor crystal can be more reliably grown.

The light-emitting device may further include a transparent electrode in contact with the surface of the group III nitride semiconductor layer on the light extraction side. In this case, a surface of the transparent electrode on the light extraction side is preferably a mirror surface. According to the structure, not only the surface of the group III nitride semiconductor layer on the light extraction side but also the surface of the transparent electrode on the light extraction side in contact with the surface is a mirror surface. Thus, the emitted light can be extracted outward in a hardly disturbed polarization state.

The transparent electrode may be formed by a transition metal film having a thickness of not more than 200 Å. Ni (refractive index: 1.8), Au (refractive index: 1.6) and Pt (refractive index: 2.9) can be illustrated as transition metals. The transition metal film may be a film consisting of Ni and Au, for example. More specifically, the transition metal film may be constituted of a single film consisting of a simple substance of any of the aforementioned transition metals or an alloy of not less than two types of transition metals, or may be constituted of a multilayer structure film thereof.

The transparent electrode may be formed by a metal oxide film. ZnO (refractive index: 2.0) and ITO (refractive index: 2.1) can be illustrated as metal oxides.

Preferably, irregularities of the surface of the transparent electrode on the light extraction side are not more than $\lambda/n_1$ (where $n_1$ represents the refractive index of the transparent electrode) with respect to an emission wavelength $\lambda$.

Preferably, irregularities of the surface of the group III nitride semiconductor layer on the light extraction side are not more than $\lambda/n_2$ (where $n_2$ represents the refractive index of the group III nitride semiconductor layer) with respect to the emission wavelength $\lambda$.

The refractive index of gallium nitride is about 2.5 and the refractive index of the material for the transparent electrode is as described above, and hence the irregularities of the surface on the light extraction side are set to not more than 100 nm when the emission wavelength is 400 to 500 nm, for example, so that the surface on the light extraction side becomes a mirror surface. In other words, the surface on the light extraction side becomes a surface having planarity hardly influencing the polarization state of the light emitted in the group III nitride semiconductor layer.

A light-emitting device according to another aspect of the present invention includes a group III nitride semiconductor layer of a multilayer structure consisting of a group III nitride semiconductor having a major surface defined by a nonpolar plane or a semipolar plane and having at least an n-type layer and a p-type layer, and an electrode is provided on the surface of the group III nitride semiconductor layer. According to the structure, light of an excellent polarization state can be emitted.

The electrode may be a p-side electrode.

As to light outputs of a light emitting layer from the nonpolar plane or the semipolar plane, a light output in a c-axis direction is preferably not less than five times as compared with a light output in an a-axis direction. When the light emitting layer consists of a group III nitride semiconductor layer having a major surface defined by an m-plane, for example, light having strong polarization intensity in the a-axis direction is generated. A polarization component in the a-axis direction is propagated in the c-axis direction, whereby the light output in the c-axis direction is not less than five times the light output in the a-axis direction. An efficient light-emitting device having a light extraction direction along a c-axis direction can be constituted by utilizing this. More specifically, an efficient semiconductor laser diode having a waveguide formed along a c-axis direction can be constituted.

Preferably, the electrode is in the form of stripes. According to the structure, a current can be narrowed and concentrated due to the electrode in the form of stripes, whereby efficient laser oscillation is enabled.

Preferably, the electrode is in the form of stripes along the c-axis direction. According to the structure, light propagated in the c-axis direction can be extracted. Further, a spontaneous emission component contributing to laser oscillation can be efficiently generated in a case of constituting a semiconductor laser diode, for example.

The light-emitting device may be a laser diode having a pair of end faces parallel to a c-plane. According to the structure, a light output in the c-axis direction is high, whereby a light emitting element contributing to oscillation can be efficiently utilized.

Preferably, the end faces are defined by cleavage planes. According to the structure, an individual device can be prepared by cleavage and excellent end faces are obtained, whereby a laser diode excellent in mass productivity can be implemented. Further, c-planes are symmetry planes, whereby the same are excellent in cleavability, and excellent end faces can be obtained. The advantage is obtained also when cavity end faces are defined by a-planes which are similarly symmetry planes, i.e., when the electrode is in the form of stripes along an a-axis direction.

Preferably, the light-emitting device has an insulating film between the electrode and the group III nitride semiconductor layer. According to the structure, the contact area between the electrode and the group III nitride semiconductor layer can be limited by the insulating film, whereby current narrowing is enabled. Further, the area of the overall electrode can be enlarged, whereby connection to a wire or an external circuit can be excellently performed.

Preferably, the major surface of the group III nitride semiconductor layer is defined by an m-plane. According to the structure, the group III nitride semiconductor can be grown at a high V/III ratio, while planarity and microcrystallinity can be improved.

Preferably, the p-side electrode has not less than two contact regions to the group III nitride semiconductor layer. According to the structure, laser oscillation can be simultaneously caused in a plurality of stripe structures, or laser oscillation can be caused in each stripe structure.

The foregoing and other objects, features and effects of the present invention will become more apparent from the following detailed description of the embodiments with reference to the attached drawings.

BRIEF DESCRIPTION OF THE DRAWINGS

FIG. 2 A schematic view showing a unit cell of the crystal structure of a group III nitride semiconductor.

FIG. 9 A schematic diagram for illustrating the structure of a light-emitting diode according to a third embodiment of the present invention.

FIG. 10 A schematic diagram for illustrating the structure of a light-emitting diode according to a fourth embodiment of the present invention.

DESCRIPTION OF THE REFERENCE NUMERALS

1 . . . GaN monocrystalline substrate, 2 . . . group III nitride semiconductor layered portion, 2a . . . surface (mirror surface) of GaN semiconductor layer, 3 . . . anode electrode (transparent electrode), 3a . . . surface (mirror surface) of anode electrode, 4 . . . connecting portion, 5 . . . cathode electrode, 7 . . . recess, 10 . . . support substrate, 11, 12 . . . wire, 13, 14 . . . bonding wire, 18 . . . metallic post, 21 . . . n-type contact layer, 21a . . . surface of n-type contact layer (surface of GaN semiconductor layer: mirror surface), 22 . . . quantum well layer, 23 . . . p-type electron blocking layer, 24 . . . p-type contact layer, 25 . . . final barrier layer, 30 . . . treating chamber, 31 . . . heater, 32 . . . susceptor, 33 . . . rotating shaft, 34 . . . rotational driving mechanism, 35 . . . wafer, 36 . . . exhaust pipe, 40 . . . source gas feed passage, 41 . . . nitrogen material pipe, 42 . . . gallium material pipe, 43 . . . aluminum material pipe, 44 . . . indium material pipe, 45 . . . magnesium material pipe, 46 . . . silicon material pipe, 51 . . . nitrogen material valve, 52 . . . gallium material valve, 53 . . . aluminum material valve, 54 . . . indium material valve, 55 . . . magnesium material valve, 56 . . . silicon material valve, 71 . . . substrate (GaN monocrystalline substrate), 72 . . . group III nitride semiconductor multilayer structure, 73 . . . n-side electrode, 74 . . . p-side electrode, 74a . . . contact region, 76 . . . insulating layer, 76a . . . opening, 80 . . . light emitting layer, 81 . . . n-type semiconductor layered portion, 82 . . . p-type semiconductor layered portion, 83 . . . n-type GaN contact layer, 84 . . . n-type AlGaN cladding layer, 85 n-type GaN guide layer, 86 . . . p-type AlGaN electron blocking layer, 87 . . . p-type GaN guide layer, 88 . . . p-type AlGaN cladding layer, 89 . . . p-type GaN contact layer, 91, 92 . . . end face, 93, 94 . . . insulating film, 70, 100, 110 . . . semiconductor laser diode.

BEST MODE FOR CARRYING OUT THE INVENTION

Figure 1:
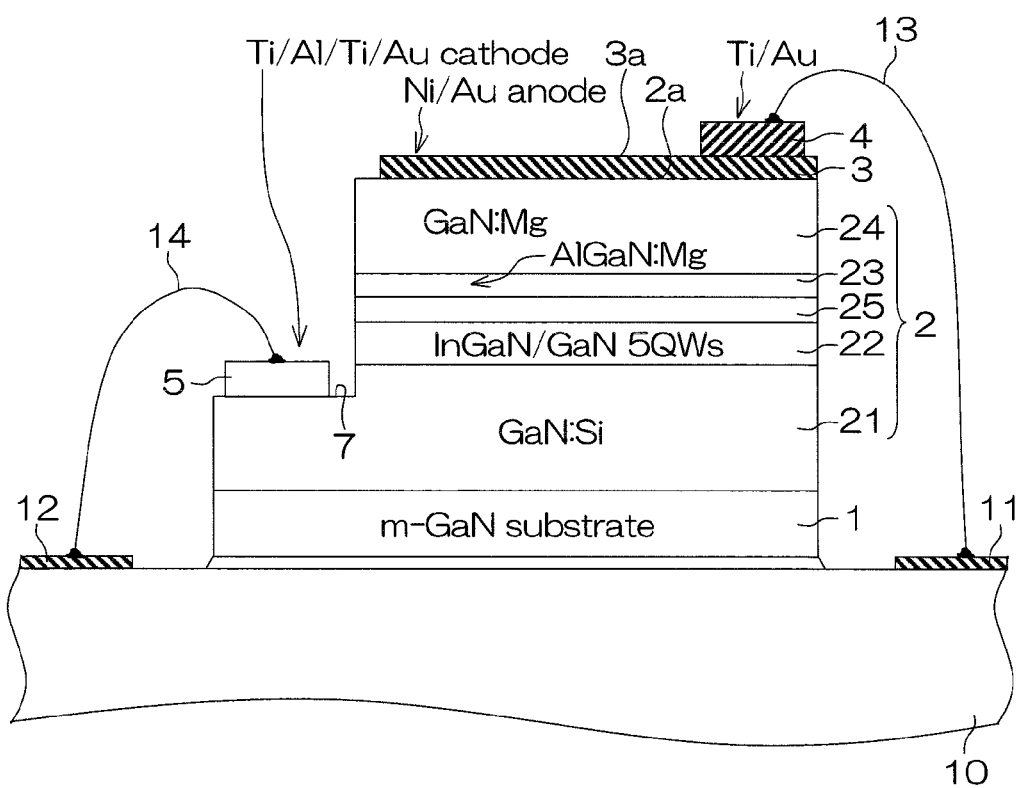
FIG. 1 A schematic sectional view for illustrating the structure of a light-emitting diode according to an embodiment of the present invention.

FIG. 1 is a schematic sectional view for illustrating the structure of a light-emitting diode according to an embodiment of the present invention. The light-emitting diode is formed by regrowing a group III nitride semiconductor layered portion 2 as a group III nitride semiconductor layer on a GaN (gallium nitride) monocrystalline substrate 1. The group III nitride semiconductor layered portion 2 has a multilayer structure formed by successively stacking an n-type contact layer 21, a quantum well (QW) layer 22 as a light emitting layer, a GaN final barrier layer 25, a p-type electron blocking layer 23 and a p-type contact layer 24 from the side closer to the GaN monocrystalline substrate 1. An anode electrode 3 as a transparent electrode is formed on the surface of the p-type contact layer 24, and a connecting portion 4 for wire connection is bonded to a part of the anode electrode 3. A cathode electrode 5 is bonded to the n-type contact layer 21. Thus, a light-emitting diode structure is formed.

The GaN monocrystalline substrate 1 is bonded to a support substrate (wiring board) 10. Wires 11 and 12 are formed on the surface of the support substrate 10. The connecting portion 4 and the wire 11 are connected with each other by a bonding wire 13, while the cathode electrode 5 and the wire 12 are connected with each other by a bonding wire 14. Further, the light-emitting diode structure and the bonding wires 13 and 14 are sealed with transparent resin such as epoxy resin to constitute a light-emitting diode device, although illustration is omitted.

The n-type contact layer 21 is formed by an n-type GaN layer containing silicon added as an n-type dopant. The layer thickness is preferably set to not less than 3 μm. The doping concentration of silicon is set to $10^{18}$ cm$^{-3}$, for example.

The quantum well layer 22 is formed by alternately stacking InGaN layers (each having a thickness of 3 nm, for example) doped with silicon and GaN layers (each having a thickness of 9 nm, for example) by a prescribed number of cycles (five cycles, for example). The GaN final barrier layer 25 (having a thickness of 40 nm, for example) is stacked between the quantum well layer 22 and the p-type electron blocking layer 23.

The p-type electron blocking layer 23 is formed by an AlGaN layer containing magnesium added as a p-type dopant. The layer thickness is 28 nm, for example. The doping concentration of magnesium is set to $3\times10^{19}$ cm$^{-3}$, for example.

The p-type contact layer 24 is formed by a GaN layer containing magnesium added as a p-type dopant in a high concentration. The layer thickness is 70 nm, for example. The doping concentration of magnesium is set to $10^{20}$ cm$^{-3}$, for example. The surface of the p-type contact layer 24 forms a surface 2a of the group III nitride semiconductor layered portion 2, and the surface 2a is a mirror surface. More specifically, irregularities of the surface 2a are not more than 100 nm. Assuming that $n_2$ ($n_2 \approx 2.5$) represents the refractive index of GaN and λ represents an emission wavelength, it can be said that the irregularities form a mirror surface not generally influencing light if the irregularities of the surface 2a are not more than $\lambda/n_2$. The surface 2a is a surface on a light extraction side from which light emitted in the quantum well layer 22 is extracted.

The anode electrode 3 is constituted of a thin transparent metallic layer (not more than 200 Å, for example) constituted of Ni (refractive index: 1.8) and Au (refractive index: 1.6). The surface 2a of the group III nitride semiconductor layered portion 2 is a mirror surface, and hence a surface 3a (a surface on the light extraction side) of the anode electrode 3 formed in contact with the surface 2a is also a mirror surface. In other words, irregularities of the surface 3a are not more than 100 nm, for example. Assuming that $n_1$ ($n_1$=1.6 to 1.8) represents the refractive index of the anode electrode 3 and λ represents the emission wavelength, it can be said that the irregularities form a mirror surface not generally influencing light if the irregularities of the surface 3a are not more than $\lambda/n_1$. Thus, both of the surface 2a of the group III nitride semiconductor layered portion 2 on the light extraction side and the surface 3a of the anode electrode 3 on the light extraction side are mirror surfaces, whereby it follows that the light emitted from the quantum well layer 22 is extracted to the side of the anode electrode 3 while the polarization state thereof is hardly influenced.

The cathode electrode 5 is a film constituted of a Ti layer and an Al layer.

The GaN monocrystalline substrate 1 is a substrate consisting of a GaN monocrystal having a major surface defined by a plane other than a c-plane. More specifically, the major surface is defined by a nonpolar plane or a semipolar plane. Further specifically, the major surface of the GaN monocrystalline substrate 1 is a surface having an offset angle of within ±1° from the surface orientation of a nonpolar plane or a surface having an offset angle of within ±1° from the surface orientation of a semipolar plane.

FIG. 2 is a schematic diagram showing a unit cell of the crystal structure of a group III nitride semiconductor. The crystal structure of the group III nitride semiconductor can be approximated by a hexagonal system, and four nitrogen atoms are bonded to each group III atom. The four nitrogen atoms are located on four vertices of a regular tetrahedron having the group III atom disposed at the center thereof. One of the four nitrogen atoms is located in a +c-axis direction of the group III atom, while the remaining three nitrogen atoms are located on a −c-axis side of the group III atom. Due to the structure, the direction of polarization is along the c-axis in the group III nitride semiconductor.

The c-axis is along the axial direction of a hexagonal prism, and a surface (the top face of the hexagonal prism) having the c-axis as a normal is a c-plane (0001). When a crystal of the group III nitride semiconductor is cleaved along two planes parallel to the c-plane, group III atoms align on the crystal plane (+c-plane) on the +c-axis side, and nitrogen atoms align on the crystal plane (−c-plane) on the −c-axis side. Therefore, c-planes, exhibiting different properties on the +c-axis side and the −c-axis side, are called polar planes.

The +c-plane and the −c-plane are different crystal planes, and hence responsively exhibit different physical properties. More specifically, it has been recognized that the +c-plane has high durability against chemical reactivity such as high resistance against alkali, while the −c-plane is chemically weak and dissolved in alkali, for example.

On the other hand, the side surfaces of the hexagonal prism are defined by m-planes (10-10) respectively, and a surface passing through a pair of unadjacent ridges is defined by an a-plane (11-20). The crystal planes, perpendicular to the c-planes and orthogonal to the direction of polarization, are planes having no polarity, i.e., nonpolar planes. Further, crystal planes inclined (neither parallel nor perpendicular) with respect to the c-planes, obliquely intersecting with the direction of polarization, are planes having slight polarity, i.e., semipolar planes. Specific examples of the semipolar planes are planes such as a (10-1-1) plane, a (10-1-3) plane, a (11-22) plane and the like.

Non-Patent Document 1 describes the relation between angles of deviation of crystal planes with respect to c-planes and polarization of the crystal planes in normal directions. From the Non-Patent Document 1, it can be said that a (11-24) plane, a (10-12) plane etc. are also less polarized planes, and powerful crystal planes employable for extracting light of a large polarization state.

For example, a GaN monocrystalline substrate having a major surface defined by an m-plane can be cut out of a GaN monocrystal having a major surface defined by a c-plane. The m-plane of the cut substrate is polished by chemical mechanical polishing, for example, so that azimuth errors with respect to both of a (0001) direction and a (11-20) direction are within ±1° (preferably within ±0.3°). Thus, a GaN monocrystalline substrate having a major surface defined by an m-plane with no crystal defects such as dislocations and stacking faults is obtained. Only steps of an atomic level are formed on the surface of such a GaN monocrystalline substrate. A nonpolar plane The light-emitting diode (LED) structure is grown on the GaN monocrystalline substrate obtained in such a manner by MOCVD.

Figure 3:
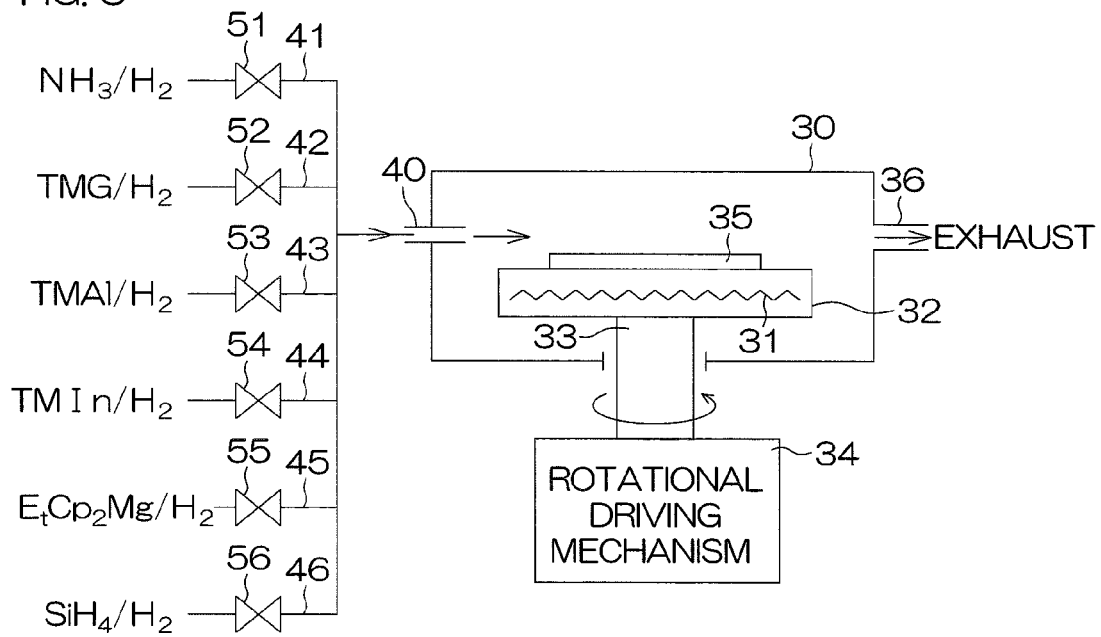
FIG. 3 A schematic diagram for illustrating the structure of a treating apparatus for growing phases constituting a GaN semiconductor layer.

FIG. 3 is a schematic diagram for illustrating the structure of a treating apparatus for growing the phases constituting the group III nitride semiconductor layered portion 2. A susceptor 32 storing a heater 31 is arranged in a treating chamber 30. The susceptor 32 is coupled to a rotating shaft 33, and the rotating shaft 33 is rotated by a rotational driving mechanism 34 arranged outside the treating chamber 30. Thus, the susceptor 32 holds a wafer 35 to be treated, so that the wafer 35 can be heated to a prescribed temperature and rotated in the treating chamber 30. The wafer 35 is a GaN monocrystalline wafer constituting the aforementioned GaN monocrystalline substrate 1.

An exhaust pipe 36 is connected to the treating chamber 30. The exhaust pipe 36 is connected to exhaust equipment such as a rotary pump. Thus, the pressure in the treating chamber 30 is set to 1/10 atm to ordinary pressure (preferably about 1/5 atm), and the atmosphere in the treating chamber 30 is regularly exhausted.

On the other hand, a source gas feed passage 40 for feeding source gas toward the surface of the wafer 35 held by the susceptor 32 is introduced into the treating chamber 30. A nitrogen material pipe 41 feeding ammonia as nitrogen source gas, a gallium material pipe 42 feeding trimethyl gallium (TMG) as gallium source gas, an aluminum material pipe 43 feeding trimethyl aluminum (TMAl) as aluminum source gas, an indium material pipe 44 feeding trimethyl indium (TMIn) as indium source gas, a magnesium material pipe 45 feeding ethylcyclopentadienyl magnesium (EtCp$_2$Mg) as magnesium source gas and a silicon material pipe 46 feeding silane (SiH$_4$) as source gas of silicon are connected to the source gas feed passage 40. Valves 51 to 56 are interposed in the material pipes 41 to 46 respectively. Each source gas is fed along with the carrier gas consisting of hydrogen and/or nitrogen.

For example, a GaN monocrystalline wafer having a major surface defined by an m-plane is held by the susceptor 32 as the wafer 35. In this state, the nitrogen material valve 51 is opened while the valves 52 to 56 are kept closed, so that the carrier gas and ammonia gas (nitrogen source gas) are fed into the treating chamber 30. Further, the heater 31 is electrified, and the wafer temperature is increased to 1000° C. to 1100° C. (1050° C., for example). Thus, GaN semiconductors can be grown without roughening the surface.

After waiting until the wafer temperature reaches 1000° C. to 1100° C., the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type GaN contact layer 21 consisting of the GaN layer doped with silicon is grown on the surface of the wafer 35.

Then, the silicon material valve 56 is closed, and growth of the quantum well layer 22 is performed. The quantum well layer 22 can be grown by alternately carrying out a step of growing an InGaN layer by opening the nitrogen material valve 51, the gallium material valve 52 and the indium material valve 52 for feeding ammonia, trimethyl gallium and trimethyl indium to the wafer 35 and a step of growing an additive-free GaN layer by closing the indium material valve 54 and opening the nitrogen material valve 51 and the gallium material valve 52 for feeding ammonia and trimethyl gallium to the wafer 35. For example, a GaN layer is formed at first, and an InGaN layer is formed thereon. After the operation is repetitively performed over five times, the GaN final barrier layer 25 is finally formed on the InGaN layer. In the formation of the quantum well layer 22 and the GaN final barrier layer 25, the temperature of the wafer 35 is preferably set to 700° C. to 800° C. (730° C., for example), for example.

Then, the p-type electron blocking layer 23 is formed. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed toward the wafer 35, and it follows that the p-type electron blocking layer 23 consisting of the AlGaN layer doped with magnesium is formed. In the formation of the p-type electron blocking layer 23, the temperature of the wafer 35 is preferably set to 1000° C. to 1100° C. (1000° C., for example).

Then, the p-type contact layer 24 is formed. In other words, the nitrogen material valve 51, the gallium material valve 52 and the magnesium material valve 55 are opened, and the remaining valves 53, 54 and 56 are closed. Thus, ammonia, trimethyl gallium and ethylcyclopentadienyl magnesium are fed toward the wafer 35, and it follows that the p-type contact layer 24 consisting of the GaN layer doped with magnesium is formed. In the formation of the p-type contact layer 24, the temperature of the wafer 35 is preferably set to 1000° C. to 1100° C. (1000° C., for example).

When the group III nitride semiconductor layered portion 2 is grown on the wafer 35 in such a manner, the wafer 35 is transferred to an etching apparatus, and a recess 7 for exposing the n-type contact layer 21 is formed by plasma etching, for example, as shown in FIG. 1. The recess 7 may be formed to surround the quantum well layer 22, the p-type electron blocking layer 23 and the p-type contact layer 24 in an island like manner, and the quantum well layer 22, the p-type electron blocking layer 23 and the p-type contact layer 24 may be thereby shaped into mesas.

Further, the anode electrode 3, the connecting portion 4 and the cathode electrode 5 are formed by resistance heating or a metal vapor deposition apparatus employing an electron beam. Thus, the light-emitting diode structure shown in FIG. 1 can be obtained.

After such a wafer process, each individual device is cut out by cleaving the wafer 35, and the individual device is connected to a leading electrode by die bonding and wire bonding, and thereafter sealed in transparent resin such as epoxy resin. Thus, the light-emitting diode device is prepared.

When the layers 21 to 24 constituting the group III nitride semiconductor layered portion 2 are grown on the wafer 35 (the GaN monocrystalline substrate 1), a V/III ratio indicating the ratio of the molar fraction of the nitrogen material (ammonia) to the molar fraction of the gallium material (trimethyl gallium) fed to the wafer 35 in the treating chamber 30 is maintained at a high value of not less than 3000 in the growth of each layer. While such a high V/III ratio has been applied to growth of a GaN crystal having a major surface defined by a c-plane, there is no report on application to growth of a group III nitride semiconductor layer having a major surface defined by a plane other than the c-plane.

According to the embodiment, the group III nitride semiconductor layered portion 2 having the major surface defined by an m-plane or the like is grown in a dislocation-free state in a planar manner by employing such a high V/III ratio and without interposing a buffer layer between the GaN monocrystalline substrate 1 and the group III nitride semiconductor layered portion 2.

Figure 4A:
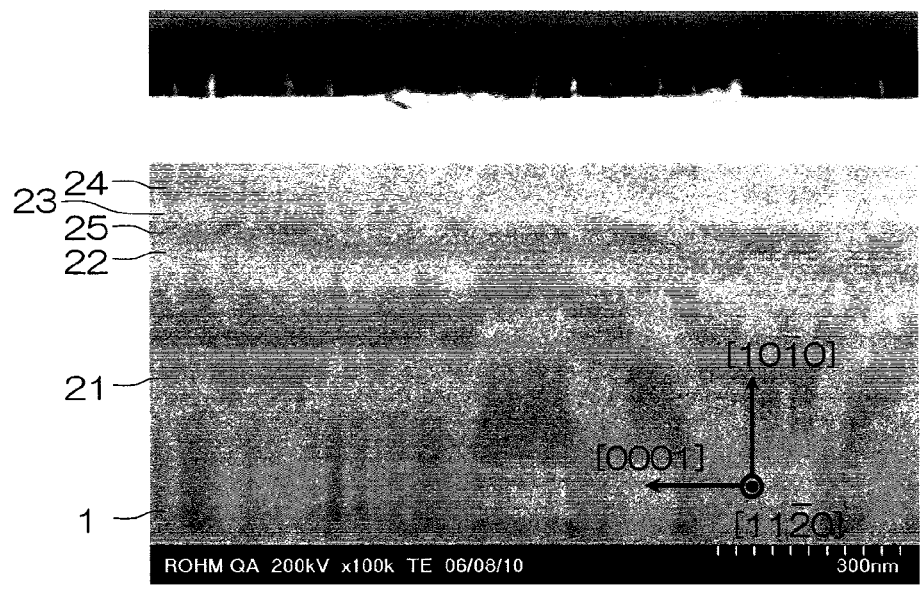
FIG. 4A An electron micrograph showing an example of a device prepared by the inventor of the present invention, with a layer section shown on an a-plane.
Figure 4B:
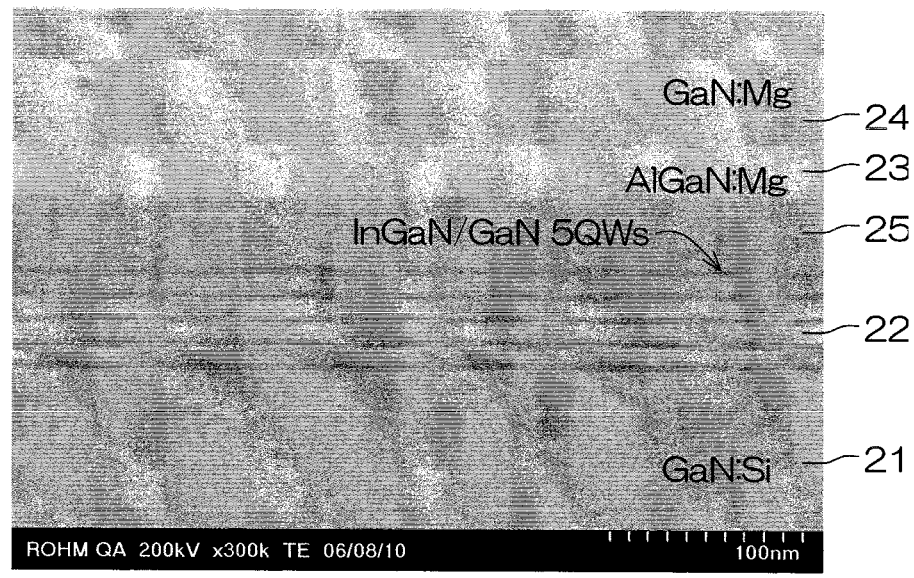
FIG. 4B An electron micrograph showing the example of the device prepared by the inventor of the present invention, with the layer section shown on the a-plane in an enlarged manner.
Figure 4C:
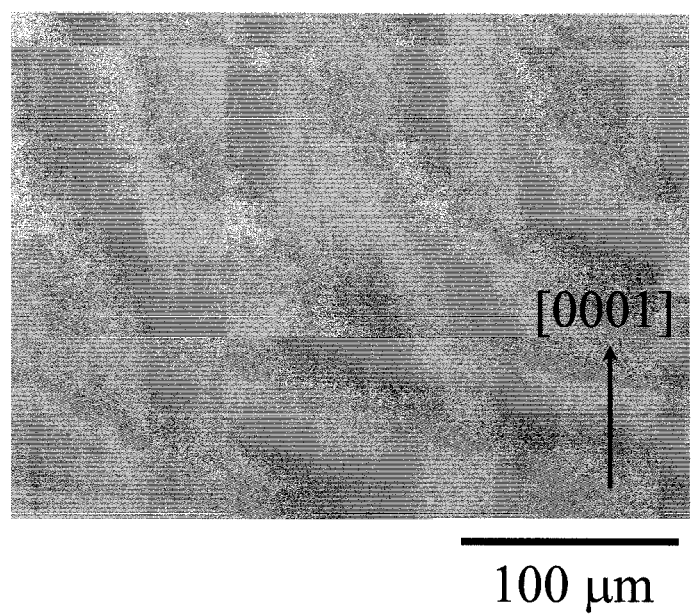
FIG. 4C An electron micrograph showing the example of the device prepared by the inventor of the present invention, showing the surface of a GaN semiconductor layer.

FIGS. 4A, 4B and 4C are micrographs showing an example of a device prepared by the inventor of the present invention. In the example, a group III nitride semiconductor layered portion 2 having a major surface defined by an m-plane is grown on a GaN monocrystalline substrate 1 having a major surface defined by an m-plane. FIGS. 4A and 4B are electron microscope (STEM: scanning transmission electron microscope) photographs showing a section along an a-plane, and the right-and-left directions of the photographs are parallel to a c-axis. FIG. 4B is an enlarged photograph around a quantum well layer 22. FIG. 4C is an optical micrograph taking the surface of an n-type contact layer 21 before formation of an anode electrode 3. No striations showing the presence of dislocations are observed from FIGS. 4A, 4B and 4C, and it is understood that the surface state is planar (a mirror surface in the example). Thus, an m-plane group III nitride semiconductor layered portion 2 having a dislocation-free and planar surface state can be grown. At this time, it is understood that a low V/III ratio having been required in general is unnecessary. However, the offset angle of the major surface of the GaN monocrystalline substrate 1 must be controlled in the aforementioned range. The surface 2a of the group III nitride semiconductor layered portion 2 is planar, and hence the surface 3a of the anode electrode 3 formed on the surface 2a is also a planar surface.

Figure 5:
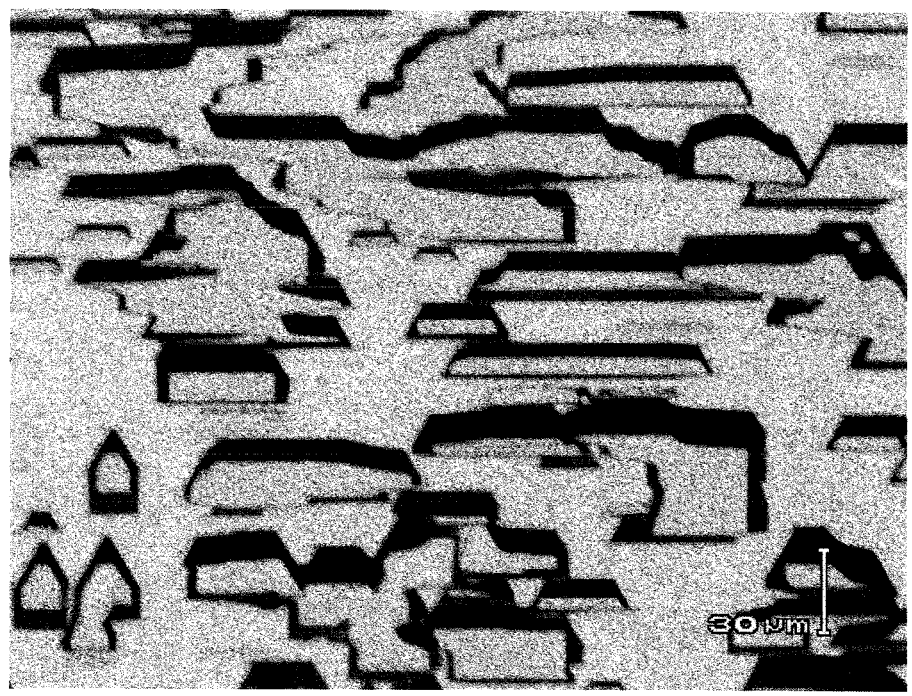
FIG. 5 An optical micrograph showing the state of a surface in a case of growing a GaN semiconductor layer on a GaN monocrystalline substrate having an offset angle set to 2°.

FIG. 5 is an optical micrograph taking the state of a surface in a case of growing a GaN semiconductor layer on an m-plane GaN monocrystalline substrate having an offset angle set to 2°. GaN crystals are grown in the form of terraces, and a planar surface state cannot be obtained dissimilarly to the case of setting the offset angle within ±1°.

Figure 6:
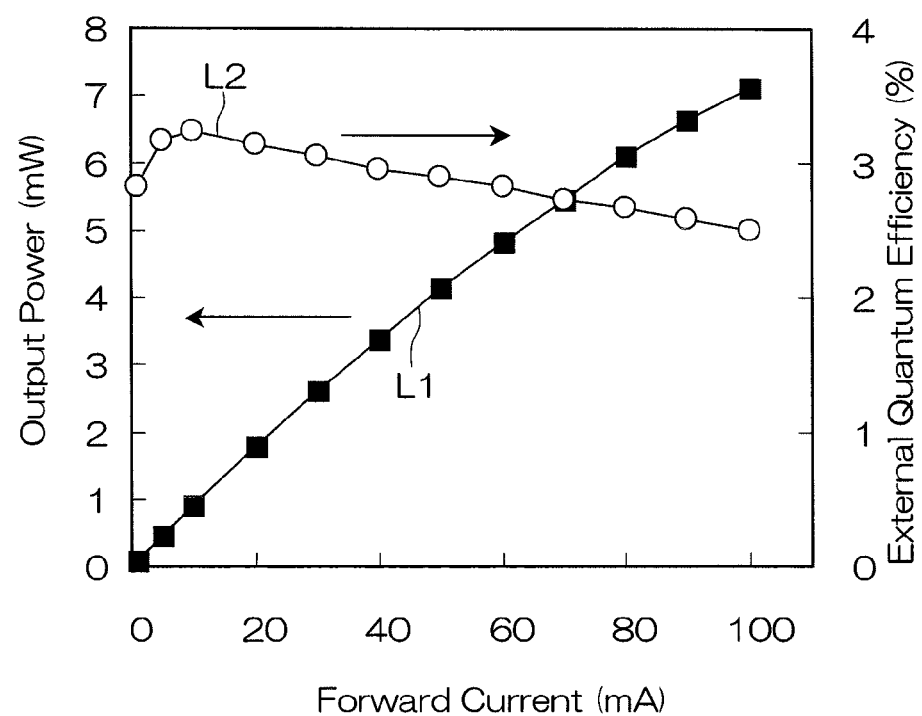
FIG. 6 Shows results of measuring electroluminescence (EL) characteristics as to a light-emitting diode device of the structure of the embodiment.

FIG. 6 shows results of measuring electroluminescence (EL) characteristics as to alight-emitting diode device of the structure of the embodiment. Referring to FIG. 6, a curve L1 shows EL output power with respect to various continuous wave (CW) forward currents, and a curve L2 shows external quantum efficiency with respect to various continuous wave forward currents.

When the forward current is 20 mA (forward voltage: 5V), for example, the EL output power is 1.79 mW, and the external quantum efficiency at this time is 3.1%. The EL output power has a value greater by seven times as compared with a value (240 μW at a forward current of 20 mA) reported in Non-Patent Document 2, for example. Such high EL output power is conceivably brought by reduction of the number of dislocations.

As observed in the curve L1, the EL output power exhibits excellent linearity with respect to increase in the forward current up to 100 mA.

Internal quantum efficiency (the ratio of luminous intensity at 300 K to luminous intensity at 300 K) measured by photo-excitation with an He—Cd laser having a wavelength of 325 nm was 5.5%.

Figure 7:
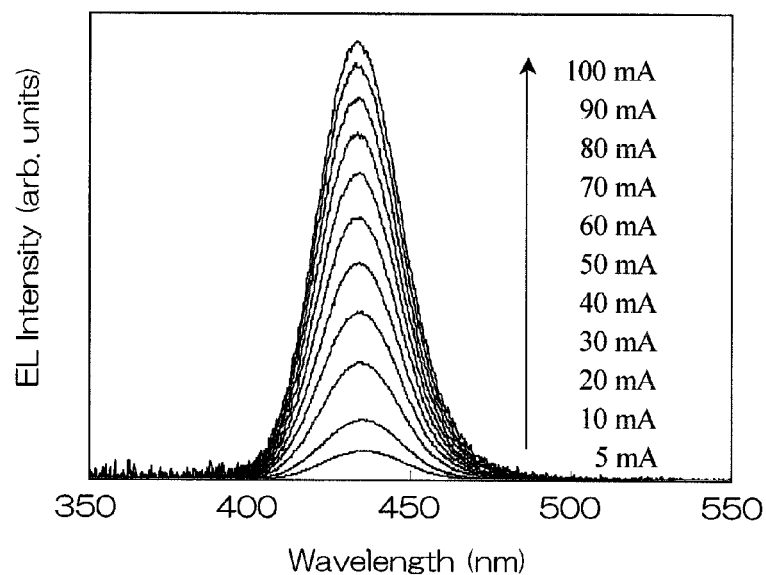
FIG. 7 EL spectra with respect to various forward currents in the light-emitting diode device are shown.

FIG. 7 shows EL spectra with respect to various forward currents. The axis of abscissas shows wavelengths, and the axis of ordinates shows EL intensity values in arbitrary units. A peak wavelength at a forward current of 20 mA is 435 nm (blue region). A peak wavelength at a forward current of 1 mA is 437 nm, and a peak wavelength at a forward current of 100 mA. In other words, fluctuation of the peak wavelength with the forward current is 3 nm. The irregularities of the surface 2a of the group III nitride semiconductor layered portion 2 and the surface 3a of the anode electrode 3 are not more than 100 nm as hereinabove described, whereby the same hardly influence on polarization of light in the wave range.

It has also been confirmed that the direction of polarization of the EL emission is orthogonal to a c-axis (polarized in an a-axis direction). A polarization ratio was 0.77 when the forward current was 1 mA. The polarization ratio is a value provided by (Io−Ip)/(Io+Ip) with intensity Io of polarization orthogonal to a c-axis (intensity of polarization in an a-axis direction) and intensity Ip of polarization parallel to the c-axis. In general, light is propagated in a direction perpendicular to the direction of polarization, and hence a polarization component in an a-axis direction is propagated in a c-axis direction. Consequently, a light output in the c-axis direction is not less than five times a light output in the a-axis direction.

Figure 8:
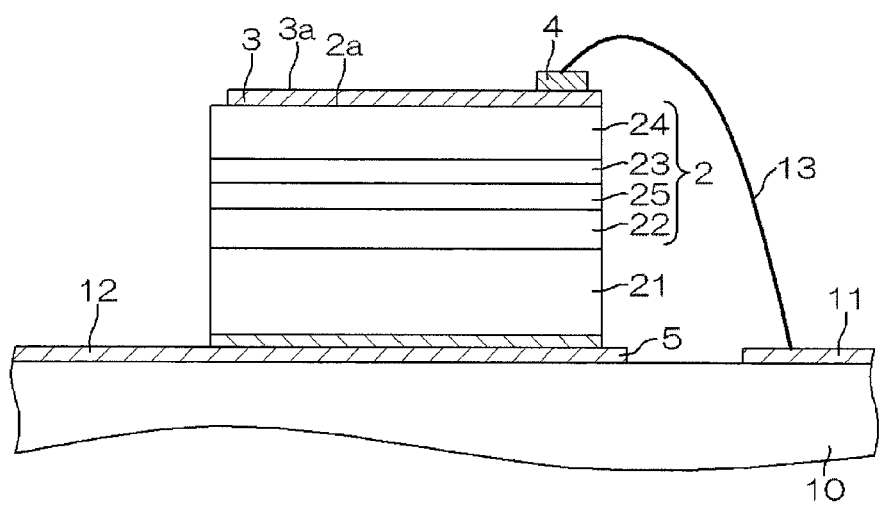
FIG. 8 A schematic diagram for illustrating the structure of a light-emitting diode according to a second embodiment of the present invention.

FIG. 8 is a schematic diagram for illustrating the structure of a light-emitting diode according to a second embodiment of the present invention. Referring to FIG. 8, portions corresponding to the respective portions shown in the aforementioned FIG. 1 are denoted by the same reference numerals. According to the embodiment, a group III nitride semiconductor layered portion 2 is grown on a GaN monocrystalline substrate 1, and the GaN monocrystalline substrate 1 is thereafter removed by polishing or the like. Thus, an n-type contact layer 21 is exposed. A cathode electrode 5 is formed on the surface (the lower surface) of the exposed contact layer 21. The cathode electrode 5 is bonded (die-bonded) to a wire 12 on a support substrate 10. Thus, a light-emitting diode structure is fixed to the support substrate 10. On the other hand, an anode electrode (transparent electrode) 3 formed in contact with a surface 2a of the group III nitride semiconductor layered portion 2 on the light extraction is connected to a wire 11 on the support substrate 10 by a bonding wire 13 through a connecting portion 4.

Also in such a structure, both of the surface 2a of the GaN semiconductor 2 on the light extraction side and the surface 3a of the anode electrode 3 on the light extraction side are mirror surfaces, whereby light emitted from the group III nitride semiconductor layered portion 2 can be extracted to the side of the anode electrode 3 in a hardly disturbed polarization state.

FIG. 9 is a schematic diagram for illustrating the structure of a light-emitting diode according to a third embodiment of the present invention. Referring to FIG. 9, portions corresponding to the respective portions shown in the aforementioned FIG. 1 are denoted by the same reference numerals. Also in the embodiment, a GaN monocrystalline substrate 1 is removed by polishing or the like so that an n-type contact layer 21 is exposed, similarly to the case of the aforementioned second embodiment. According to the embodiment, further, polishing (mirror finishing) such as chemical mechanical polishing is performed on a surface 21a of the n-type contact layer 21, whereby the surface 21a is worked into a mirror surface. In other words, irregularities of the surface 21a are set to not more than 100 nm. Assuming that $n_2$ ($n_2 \approx 2.5$) represents the refractive index of GaN and λ, represents an emission wavelength, it can be said that the irregularities form a mirror surface not generally influencing light if the irregularities of the surface 21a are not more than $\lambda/n_2$. The surface 21a is directed to a side opposite to a support substrate 10, to serve as a light extraction surface.

An anode electrode 3 formed on the surface of a p-type contact layer 24 is bonded (die-bonded) to a wire 11 on the support substrate 10. Thus, a light-emitting diode structure is fixed to the support substrate 10 in an attitude reversed to the cases of FIGS. 1 and 8. In this case, the anode electrode 3 may not be a transparent electrode.

On the surface 21a of the n-type contact layer 21, on the other hand, a cathode electrode 5 is formed to be bonded to a partial region thereof. The cathode electrode 5 is connected to a wire 12 on the support substrate 10 by a bonding wire 14.

Also in the structure of the embodiment, the surface 21a on a light extraction side of a group III nitride semiconductor layered portion 2 is a mirror surface, whereby light emitted from a quantum well layer 22 can be extracted outward in a hardly influenced polarization state.

FIG. 10 is a schematic diagram for illustrating the structure of a light-emitting diode according to a fourth embodiment of the present invention. Referring to FIG. 10, portions corresponding to the respective portions shown in FIG. 9 are denoted by the same reference numerals as those in the case of FIG. 9. The structure of the embodiment is similar to the structure of the third embodiment, while a connection structure between an n-type contact layer 21 and a wire 12 on a support substrate 10 is different.

In other words, a surface 21a (a surface on a light extraction side) of the n-type contact layer 21 positioned on a side opposite to the support substrate 10 is finished into a mirror surface, similarly to the case of the third embodiment. On the other hand, a GaN semiconductor 2 is etched (plasma-etched, for example) until the n-type contact layer 21 is exposed from the side of the support substrate 10, and a recess 17 is formed. A cathode electrode 5 in contact with the n-type contact layer 21 is formed in the recess 17. The cathode electrode 5 and the wire 12 on the support substrate 10 are connected with each other by a metallic post 18.

Also in the structure of the embodiment, the surface 21a on the light extraction side of the group III nitride semiconductor layered portion 2 is a mirror surface, whereby light emitted from a quantum well layer 22 can be extracted outward in a hardly influenced polarization state.

Figure 11:
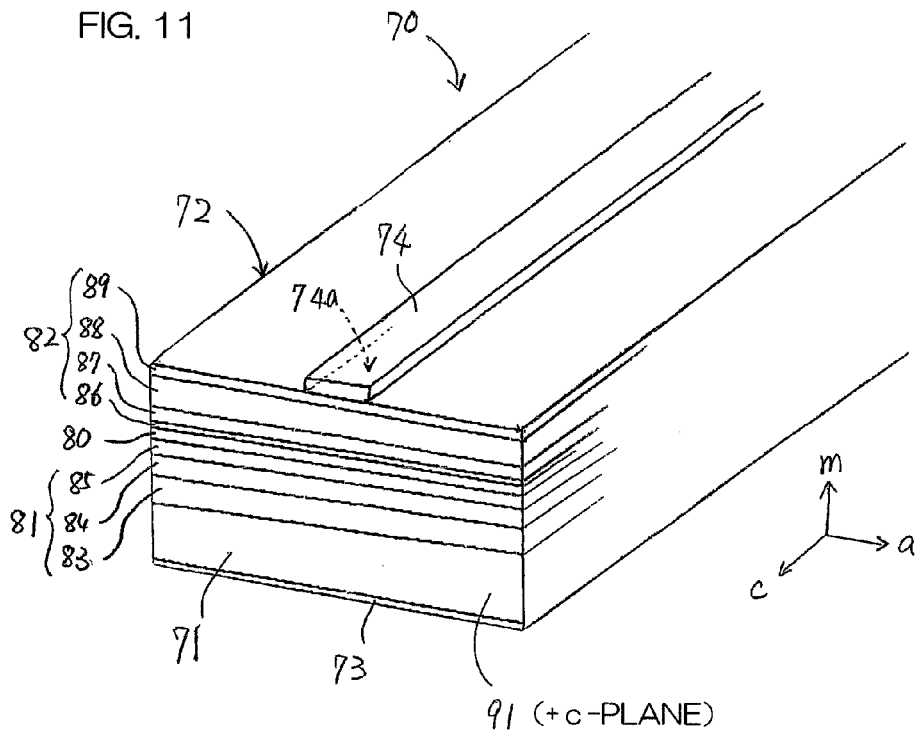
FIG. 11 A perspective view for illustrating the structure of a semiconductor laser diode according to a fifth embodiment of the present invention.
Figure 12:
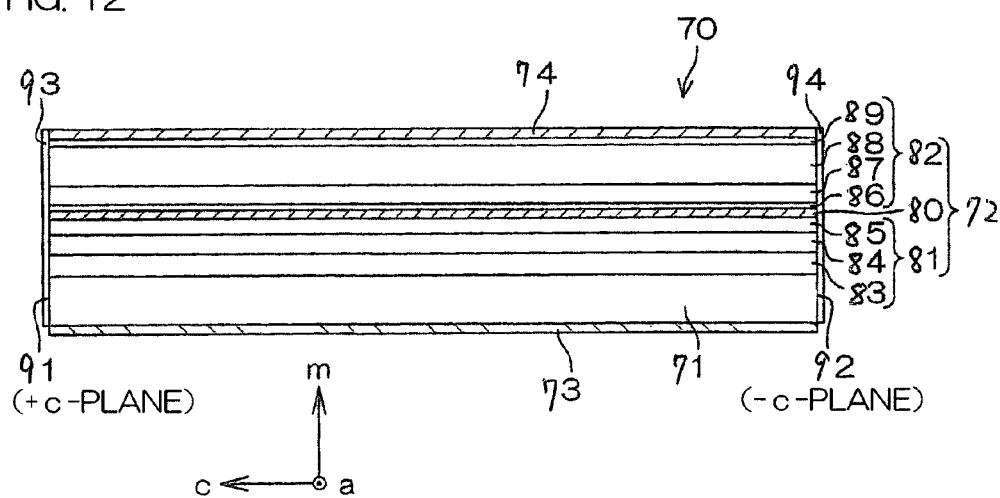
FIG. 12 A longitudinal sectional view of the semiconductor laser diode shown in FIG. 11.

FIG. 11 is a perspective view for illustrating the structure of a semiconductor laser diode which is a light-emitting device according to a fifth embodiment of the present invention, and FIG. 12 is a longitudinal sectional view thereof.

A semiconductor laser diode 70 is a Fabry-Perot laser diode including a substrate 71, a group III nitride semiconductor multilayer structure 72 formed on the substrate 71 by crystal growth, an n-type electrode 73 formed to be in contact with the rear surface (the surface opposite to the group III nitride semiconductor multilayer structure 72) of the substrate 71 and a p-type electrode 74 formed to be in contact with the surface of the group III nitride semiconductor multilayer structure 72.

The substrate 71 is constituted of a GaN monocrystalline substrate in the embodiment. The major surface of the substrate 71 is defined by an m-plane, and the group III nitride semiconductor multilayer structure 72 is formed by crystal growth on the major surface. Therefore, the group III nitride semiconductor multilayer structure 72 is made of group III nitride semiconductors having major crystal growth surfaces defined by m-planes.

The group III nitride semiconductor multilayer structure 72 includes a light emitting layer 80, an n-type semiconductor layered portion 81 and a p-type semiconductor layered portion 82. The n-type semiconductor layered portion 81 is disposed on a side of the light emitting layer 80 closer to the substrate 71, and the p-type semiconductor layered portion 82 is disposed on a side of the light emitting layer 80 closer to the p-side electrode 74. Thus, the light emitting layer 80 is held between the n-type semiconductor layered portion 81 and the p-type semiconductor layered portion 82, and a double heterojunction is provided. Electrons and positive holes are injected into the light emitting layer 80 from the n-type semiconductor layered portion 81 and the p-type semiconductor layered portion 82 respectively. The electrons and the positive holes are recombined in the light emitting layer 80, to emit light.

The n-type semiconductor layered portion 81 is formed by successively stacking an n-type GaN contact layer 83 (having a thickness of 2 μm, for example), an n-type AlGaN cladding layer 84 (having a thickness of not more than 1.5 μm such as a thickness of 1.0 μm, for example) and an n-type GaN guide layer 85 (having a thickness of 0.1 μm, for example) from the side closer to the substrate 81. On the other hand, the p-type semiconductor layered portion 82 is formed by successively stacking a p-type AlGaN electron blocking layer 86 (having a thickness of 20 nm, for example), a p-type GaN guide layer 87 (having a thickness of 0.1 μm, for example), a p-type AlGaN cladding layer 88 (having a thickness of not more than 1.5 μm such as a thickness of 0.4 μm, for example) and a p-type GaN contact layer 89 (having a thickness of 0.3 μm, for example) on the light emitting layer 80.

The n-type GaN contact layer 83 and the p-type GaN contact layer 89 are low-resistance layers for attaining ohmic contact with the n-side electrode 73 and the p-side electrode 74 respectively. The n-type GaN contact layer 83 is made of an n-type semiconductor prepared by doping GaN with Si, for example, serving as an n-type dopant in a high concentration (the doping concentration is $3\times10^{18}$ cm$^{-3}$, for example). The p-type GaN contact layer 89 is formed by a p-type semiconductor layer prepared by doping GaN with Mg serving as a p-type dopant in a high concentration (the doping concentration is $3\times10^{19}$ cm$^{-3}$, for example).

The n-type AlGaN cladding layer 84 and the p-type AlGaN cladding layer 88 provide a light confining effect confining the light from the light emitting layer 80 therebetween. The n-type AlGaN cladding layer 84 is made of an n-type semiconductor prepared by doping AlGaN with Si, for example, serving as an n-type dopant (the doping concentration is $1\times10^{18}$ cm$^{-3}$, for example). The p-type AlGaN cladding layer 88 is formed by a p-type semiconductor layer prepared by doping AlGaN with Mg serving as a p-type dopant (the doping concentration is $1\times10^{19}$ cm$^{-3}$, for example). The band gap of the n-type AlGaN cladding layer 84 is wider than that of the n-type GaN guide layer 85, and the band gap of the p-type AlGaN cladding layer 88 is wider than that of the p-type GaN guide layer 87. Thus, the light can be excellently confined, and a semiconductor laser diode having a low threshold and high efficiency can be implemented.

The n-type GaN guide layer 85 and the p-type GaN guide layer 87 are semiconductor layers providing a carrier confining effect for confining carriers (the electrons and the positive holes) in the light emitting layer 80. Thus, the efficiency of recombination of the electrons and the positive holes in the light emitting layer 80 is improved. The n-type GaN guide layer 85 is made of an n-type semiconductor prepared by doping GaN with Si, for example, serving as an n-type dopant (the doping concentration is $1\times10^{18}$ cm$^{-3}$, for example), while the p-type GaN guide layer 87 is made of a p-type semiconductor prepared by doping GaN with Mg, for example, serving as a p-type dopant (the doping concentration is $5\times10^{18}$ cm$^{-3}$, for example).

The p-type AlGaN electron blocking layer 86 is made of a p-type semiconductor prepared by doping AlGaN with Mg, for example, serving as a p-type dopant (the doping concentration is $5\times10^{18}$ cm$^{-3}$, for example), and improves the efficiency of recombination of the electrons and the positive holes by preventing the electrons from flowing out of the light emitting layer 80.

The light emitting layer 80, having an MQW (multiple-quantum well) structure containing InGaN, for example, is a layer for emitting light by recombination of the electrons and the positive holes and amplifying the emitted light. More specifically, the light emitting layer 80 is formed by alternately repetitively stacking InGaN layers (each having a thickness of 3 nm, for example) and GaN layers (each having a thickness of 9 nm, for example) by a plurality of cycles. In this case, the composition of In in each InGaN layer is set to not less than 5%, whereby a band gap is relatively reduced and the InGaN layer constitutes a quantum well layer. On the other hand, each GaN layer functions as a barrier layer having a relatively large band gap. The InGaN layers and the GaN layers are alternately repetitively stacked by two to seven cycles, for example, to constitute the light emitting layer 80 having the MQW structure. An emission wavelength is set to 400 nm to 550 nm by adjusting the composition of In in each quantum well layer (InGaN layer). In the MQW structure, the number of quantum wells containing In is preferably set to not more than 3.

The p-type semiconductor layered portion 72 has a planar upper surface. The striped (linear) p-side electrode 74 along a c-axis direction is formed at a generally central portion in a width direction (a-axis direction) on the planar upper surface of the p-type semiconductor layered portion 72. Therefore, the p-side electrode 74 is in contact with the surface (m-plane) of the p-type semiconductor layer 12 on a striped contact region 74a along the c-axis direction. The stripe width of the p-type electrode 74 is set to 1 to 100 μm, for example.

The group III nitride semiconductor multilayer structure 72 has a pair of end faces 91 and 92 (cleavage planes) formed by cleaving both ends of the striped p-side electrode 74 in the longitudinal direction (the direction of stripes. the c-axis direction). The pair of end faces 91 are parallel to each other, and both are perpendicular to c-axes (i.e., perpendicular to the direction of the stripes). Thus, a Fabry-Perot cavity having the pair of end faces 91 and 92 as cavity end faces is formed by the n-type GaN guide layer 85, the light emitting layer 80 and the p-type GaN guide layer 87. In other words, the light emitted in the light emitting layer 80 reciprocates between the cavity end faces 91 and 92, and is amplified by induced emission. The amplified light is partially extracted from the cavity end faces 91 and 92 as laser beams outward from the device.

The n-side electrode 73, made of an Al metal, for example, and the p-side electrode 74, made of a Pd/Au alloy, for example, are ohmic-connected to the p-type contact layer 89 and the substrate 71 respectively. The p-side electrode 74 is formed in a striped manner so that a current can be narrowed and concentrated, whereby efficient laser oscillation is enabled.

Further, the surface of the p-type semiconductor layered portion 82 is defined by an m-plane, and the p-side electrode 74 is formed on the m-plane. The rear surface of the substrate 71 provided with the n-side electrode 73 is also defined by an m-plane. Thus, both of the p-side electrode 74 and the n-side electrode 73 are formed on the m-planes, whereby reliability for sufficiently withstanding increase in the laser output and a high-temperature operation can be implemented.

The cavity end faces 91 and 92 are covered with insulating films 93 and 94 (illustration is omitted in FIG. 11) respectively. The cavity end face 91 is a +c-axis-side end face, and the cavity end face 92 is −c-axis-side end face. In other words, the crystal plane of the cavity end face 91 is a +c-plane, and the crystal plane of the cavity end face 92 is −c-plane. The insulating film 94 on the −c-plane-side can function as a protective film protecting the chemically weak −c-plane dissolved in alkali, and contributes to improvement in the reliability of the semiconductor laser diode 70.

Figure 13:
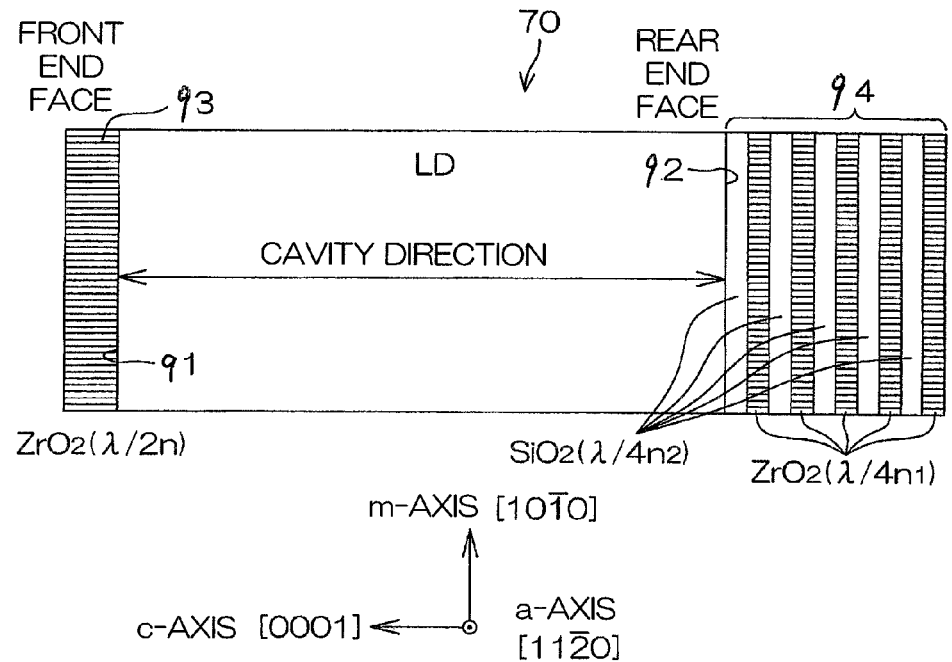
FIG. 13 A schematic sectional view for illustrating the structures of insulating films formed on cavity end faces.

As schematically shown in FIG. 13, the insulating film 93 formed to cover the cavity end face 91 defined by the +c-plane consists of a single film of $ZrO_2$, for example. On the other hand, the insulating film 94 formed on the cavity end face 92 defined by the −c-plane is constituted of a multiple reflection film formed by alternately repetitively stacking $SiO_2$ films and $ZrO_2$ films a plurality of times (five times in the example of FIG. 13), for example. The thickness of the single film of $ZrO_2$ constituting the insulating film 93 is set to $\lambda/2n_1$ (where $\lambda$ represents the emission wavelength of the light emitting layer 80. $n_1$ represents the refractive index of $ZrO_2$). On the other hand, the multiple reflection film constituting the insulating film 94 has a structure obtained by alternately stacking $SiO_2$ films each having a thickness $\lambda/4n_2$ (where $n_2$ represents the refractive index of $SiO_2$) and $ZrO_2$ films each having a thickness $\lambda/4n_1$.

According to such a structure, the reflectance on the +c-axis-side end face 91 is small, and that on the −c-axis-side end face 92 is large. More specifically, the reflectance on the +c-axis-side end face 91 is set to about 20%, and the reflectance on the −c-axis-side end face 92 is about 99.5% (generally 100%), for example. Therefore, it follows that a larger laser output is emitted from the +c-axis-side end face 91. In other words, the +c-axis-side end face 91 serves as a laser emitting end face in the semiconductor laser diode 70.

According to such a structure, light having a wavelength of 400 nm to 550 nm can be emitted by connecting the n-side electrode 73 and the p-side electrode 74 to a power source and injecting the electrons and the positive holes into the light emitting layer 80 from the n-type semiconductor layered portion 81 and the p-type semiconductor layered portion 82 respectively thereby recombining the electrons and the positive holes in the light emitting layer 80. The light reciprocates between the cavity end faces 91 and 92 along the guide layers 85 and 87, and is amplified by induced emission. Then, it follows that a larger quantity of laser output is extracted from the cavity end face 91 serving as the laser emitting end face.

When the group III nitride semiconductor multilayer structure 72 having the major growth surface defined by an m-plane is grown on the GaN monocrystalline substrate 71 having the major surface defined by an m-plane and a section along an a-plane is observed with an electron microscope (STEM: scanning transmission electron microscope), no striations showing the presence of dislocations are observed in the group III nitride semiconductor multilayer structure 72. When the surface state is observed with an optical microscope, it is understood that planarity in a c-axis direction (the difference between the heights of a terminal portion and a lowermost portion) is not more than 10 Å. This means that planarity of the light emitting layer 80, particularly the quantum well layers, in the c-axis direction is not more than 10 Å, and the half band width of an emission spectrum can be reduced.

Thus, dislocation-free m-plane group III nitride semiconductors having planar stacking interfaces can be grown. However, the offset angle of the major surface of the GaN monocrystalline substrate 71 is preferably set within ±1° (preferably within ±0.3°), and if GaN semiconductor layers are grown on an m-plane GaN monocrystalline substrate having an offset angle set to 2°, for example, GaN crystals may be grown in the form of terraces and a planar surface state may not be obtained dissimilarly to the case of setting the offset angle within ±1°.

Group III nitride semiconductors crystal-gown on the GaN monocrystalline substrate having the major surface defined by an m-plane are grown with major growth surfaces defined by m-planes. If the group III nitride semiconductors are crystal-grown with major surfaces defined by c-planes, luminous efficiency in the light emitting layer 80 may be deteriorated due to influence by polarization in the c-axis direction. When the major growth surfaces are defined by m-planes, on the other hand, polarization in the quantum well layers is suppressed, and the luminous efficiency is increased. Thus, reduction of a threshold and increase in slope efficiency can be implemented. Current dependency of the emission wavelength is suppressed due to small polarization, and a stable oscillation wavelength can be implemented.

Further, anisotropy in physical properties is caused in the c-axis direction and the a-axis direction due to the major surfaces defined by m-planes. In addition, biaxial stress resulting from lattice strain is caused in the light emitting layer 80 (active layer) containing In. Consequently, a quantum band structure is different from that of an active layer crystal-grown with major surfaces defined by c-planes. Therefore, a gain different from that in the case of the active layer with the major growth surfaces defined by c-planes, and laser characteristics are improved.

The major surfaces of crystal growth are so defined by m-planes that group III nitride semiconductor crystals can be extremely stably grown, and crystallinity can be further improved as compared with a case of defining the major crystal growth surfaces by c-planes or a-planes. Thus, a high-performance laser diode can be prepared.

The light emitting layer 80 is formed by group III nitride semiconductors grown with major crystal growth surfaces defined by m-planes, and hence the light emitted therefrom is polarized in an a-axis direction, i.e., a direction parallel to the m-planes, and travels in a c-axis direction in the case of a TE mode. Therefore, the major crystal growth surface of the semiconductor laser diode 70 is parallel to the direction of polarization, and a stripe direction, i.e., the direction of a waveguide is set parallel to the traveling direction of the light. Thus, oscillation of the TE mode can be easily caused, and a threshold current for causing laser oscillation can be reduced.

In other words, the major surfaces of crystal growth are defined by m-planes, whereby anisotropy in physical properties is caused in the c-axis direction and the a-axis direction. In the light emitting layer 80 containing In, further, a quantum well band structure different from that in the case of defining the major surfaces of crystal growth by c-planes is formed. Consequently, a gain different from that in the case of defining the major surfaces of crystal growth by c-planes is obtained, whereby the laser characteristics can be improved.

The m-planes are nonpolar planes as hereinabove described, whereby polarization in the quantum well layers is suppressed, and luminous efficiency is increased as a result. The effects of reducing the threshold and increasing the slope efficiency can be attained also by this. The current dependency of the emission wavelength is suppressed due to the absence of polarization, whereby a stable oscillation wavelength can be implemented.

On the other hand, the major surfaces of crystal growth are defined by m-planes so that the crystal growth of the group III nitride semiconductors can be extremely stably performed, whereby crystallinity of the group III nitride semiconductor multilayer structure 72 can be improved as compared with a case of defining the major surfaces of crystal growth by c-planes or a-planes. Thus, a high-performance semiconductor laser diode can be implemented.

According to the embodiment, a GaN monocrystalline substrate is employed as the substrate 71, whereby the group III nitride semiconductor multilayer structure 72 can have high crystal quality with a small number of defects. Consequently, a high-performance semiconductor laser diode can be implemented.

Further, the group III nitride semiconductor multilayer structure is grown on the generally dislocation-free GaN monocrystalline substrate, whereby the group III nitride semiconductor multilayer structure 72 can be formed by excellent crystals having neither stacking faults nor threading dislocations from a regrowth surface (m-plane) of the substrate 71. Thus, characteristic deterioration such as reduction in luminous efficiency resulting from defects can be suppressed.

As hereinabove described, the major crystal growth surfaces of the group III nitride semiconductor multilayer structure 72 are defined by m-planes so that laser oscillation efficiency is improved, and hence laser oscillation is enabled by performing current narrowing while forming the contact region 74a between the p-side electrode 74 and the p-type semiconductor layered portion 82 in a striped manner, without shaping the p-type semiconductor layer 82 into a ridge shape. In other words, the ratio of light spontaneously propagated in the c-axis direction is high without transverse confinement due to the way of emission of light itself, whereby laser oscillation is simplified. Therefore, manufacturing steps for the semiconductor laser diode can be simplified by employing the structure of FIG. 11, and a semiconductor laser diode excellent in mass productivity can be provided.

The layers constituting the group III nitride semiconductor multilayer structure 72 can be grown with the treating apparatus having the structure shown in the aforementioned FIG. 3.

For example, a GaN monocrystalline wafer having a major surface defined by an m-plane is held by the susceptor 32 as the wafer 35. In this state, the nitrogen material valve 51 is opened while the valves 52 to 56 are kept closed, and the carrier gas and the ammonia gas (nitrogen source gas) are fed into the treating chamber 30. Further, the heater 31 is electrified, and the wafer temperature is increased up to 1000° C. to 1100° C. (1050° C., for example). Thus, GaN semiconductors can be grown without roughening the surface.

After waiting until the wafer temperature reaches 1000° C. to 1100° C., the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type GaN contact layer 83 consisting of a GaN layer doped with silicon is grown on the surface of the wafer 35.

Then, the aluminum material valve 53 is opened in addition to the nitrogen material valve 51, the gallium material valve 52 and the silicon material valve 56. Thus, ammonia, trimethyl gallium, silane and trimethyl aluminum are fed from the source gas feed passage 40 along with the carrier gas. Consequently, the n-type AlGaN cladding layer 84 is epitaxially grown on the n-type GaN contact layer 83.

Then, the aluminum material valve 53 is closed, and the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type guide layer is epitaxially grown on the n-type AlGaN cladding layer 84.

Then, the silicon material valve 56 is closed, and the light emitting layer 80 (active layer) having the multiple quantum well structure is grown. The light emitting layer 80 can be grown by alternately carrying out a step of growing an InGaN layer by opening the nitrogen material valve 51, the gallium material valve 52 and the indium material valve 52 for feeding ammonia, trimethyl gallium and trimethyl indium to the wafer 35 and a step of growing an additive-free GaN layer by closing the indium material valve 54 and opening the nitrogen material valve 51 and the gallium material valve 52 for feeding ammonia and trimethyl gallium to the wafer 35. For example, a GaN layer is formed at first, and an InGaN layer is formed thereon. The operation is repetitively performed over five times, for example. In the formation of the light emitting layer 80, the temperature of the wafer 35 is preferably set to 700° C. to 800° C. (730° C., for example), for example. At this time, the growth pressure is preferably set to not less than 700 torr, whereby heat resistance can be improved.

Then, the p-type electron blocking layer 86 is formed. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed toward the wafer 35, and it follows that the p-type electron blocking layer 86 consisting of an AlGaN layer doped with magnesium is formed. In the formation of the p-type electron blocking layer 86, the temperature of the wafer 35 is preferably set to 1000° C. to 1100° C. (1000° C., for example).

Then, the aluminum material valve 53 is closed, and the nitrogen material valve 51, the gallium material valve 52 and the magnesium material valve 55 are opened. Thus, ammonia, trimethyl gallium and ethylcyclopentadienyl magnesium are fed toward the wafer 35, and it follows that the guide layer 87 consisting of a p-type GaN layer doped with magnesium is formed. In the formation of the p-type GaN guide layer 87, the temperature of the wafer 35 is preferably set to 900° C. to 1100° C. (1000° C., for example).

Then, the aluminum material valve 53 is opened again. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed toward the wafer 35, and it follows that the cladding layer 88 consisting of a p-type AlGaN layer doped with magnesium is formed. In the formation of the p-type AlGaN cladding layer 88, the temperature of the wafer 35 is preferably set to 900° C. to 1100° C. (1000° C., for example).

Then, the p-type contact layer 89 is formed. In other words, the nitrogen material valve 51, the gallium material valve 52 and the magnesium material valve 55 are opened, and the remaining valves 53, 54 and 56 are closed. Thus, ammonia, trimethyl gallium and ethylcyclopentadienyl magnesium are fed toward the wafer 35, and it follows that the p-type GaN contact layer 89 consisting of a GaN layer doped with magnesium is formed. In the formation of the p-type GaN contact layer 89, the temperature of the wafer 35 is preferably set to 900° C. to 1100° C. (1000° C., for example).

The layers constituting the p-type semiconductor layered portion 82 are preferably crystal-grown at an average growth temperature of not more than 1000° C. Thus, thermal damage on the light emitting layer 80 can be reduced.

When the layers 80 and 83 to 89 constituting the group III nitride semiconductor multilayer structure 72 are grown on the wafer 35 (the GaN monocrystalline substrate 1), a V/III ratio indicating the ratio of the molar fraction of the nitrogen material (ammonia) to the molar fraction of the gallium material (trimethyl gallium) fed to the wafer 35 in the treating chamber 30 is maintained at a high value of not less than 1000 (preferably not less than 3000) in the growth of each layer. More specifically, the average of the V/III ratios is preferably not less than 1000 from the n-type cladding layer 84 up to the uppermost p-type contact layer 89. Thus, excellent crystals having small numbers of point defects can be obtained in all of the n-type cladding layer 84, the light emitting layer 80 and the p-type cladding layer 88.

According to the embodiment, the group III nitride semiconductor layer 72 having the major surface defined by an m-plane or the like is grown in a dislocation-free state in a planar manner by employing the aforementioned high V/III ratio and without interposing a buffer layer between the GaN monocrystalline substrate 71 and the group III nitride semiconductor multilayer structure 72. The group III nitride semiconductor multilayer structure 72 has neither stacking faults nor threading dislocations formed from the major surface of the GaN monocrystalline substrate 71.

Then, the p-side electrode 74 in ohmic contact with the p-type GaN contact layer 89 is formed in the form of stripes along the c-axis direction, and the n-side electrode 73 in ohmic contact with the substrate 17 is formed. The electrodes 73 and 74 can be formed by resistance heating or a metal vapor deposition apparatus employing an electron beam, for example.

The next step is division into each individual device. In other words, each device constituting the semiconductor laser diode is cut out by cleaving the wafer 35 in a direction parallel to the striped p-side electrode 74 and a direction perpendicular thereto. The wafer 35 is cleaved in the direction parallel to the striped p-side electrode 74 along the a-plane. Further, the wafer 35 is cleaved in the direction perpendicular to the striped p-side electrode 74 along the c-plane. Thus, the cavity end face 91 defined by the +c-plane and the cavity end face 92 defined by the −c-plane are formed.

Then, the aforementioned insulating films 93 and 94 are formed on the cavity end faces 91 and 92 respectively. The insulating films 93 and 94 can be formed by electron cyclotron resonance (ECR) film formation, for example.

Figure 14:
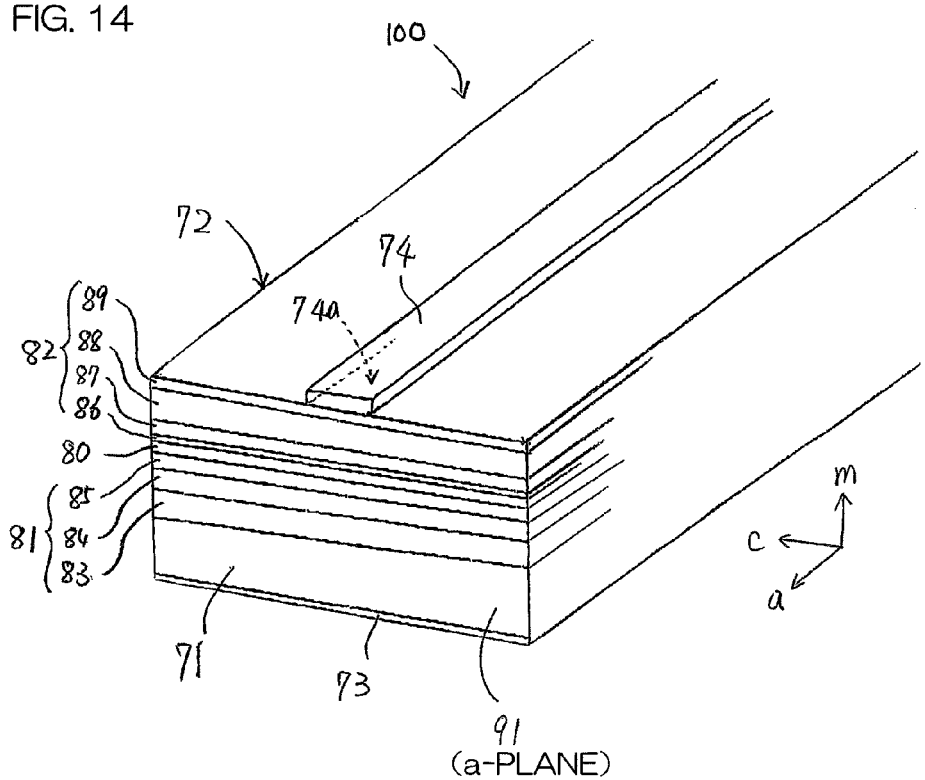
FIG. 14 A perspective view showing the structure of a semiconductor laser diode according to a sixth embodiment of the present invention.
Figure 15:
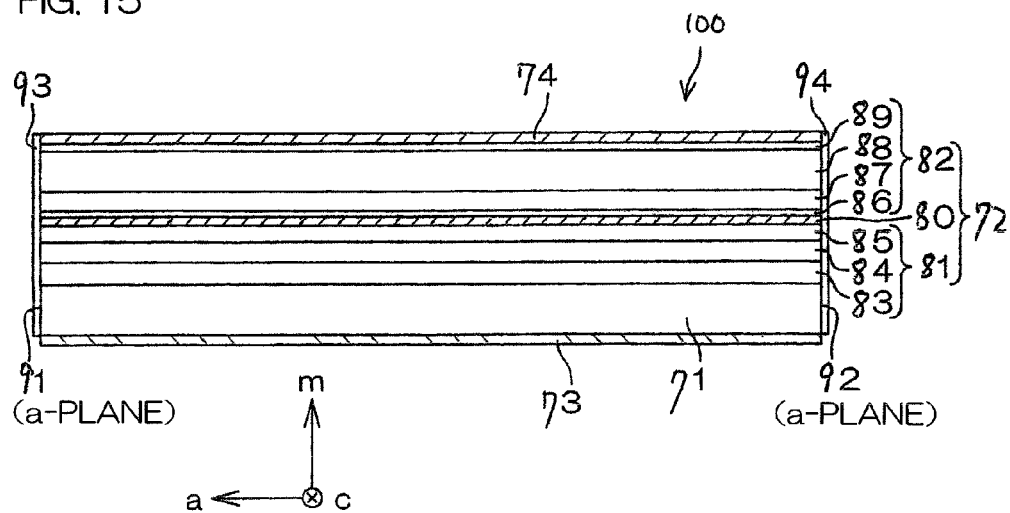
FIG. 15 A longitudinal sectional view of the semiconductor laser diode shown in FIG. 14.

FIG. 14 is a perspective view showing the structure of a semiconductor laser diode according to a sixth embodiment of the present invention, and FIG. 15 is a longitudinal sectional view thereof. Referring to FIGS. 14 and 15, portions corresponding to the respective portions shown in the aforementioned FIGS. 11 to 13 are denoted by the same reference numerals.

In a semiconductor laser diode 100 according to the embodiment, a striped p-side electrode 74 is formed parallelly to an a-axis direction, and hence both of cavity end faces 91 and 92 are defined by a-planes. The cavity end faces 91 and 92 are also defined by cleavage planes formed by cleavage.

Stacking faults resulting from epitaxy of a group III nitride semiconductor multilayer structure 82 are formed parallelly to a c-plane. In the structure of the aforementioned fifth embodiment, therefore, it follows that stacking faults and the waveguide intersect with one another. According to the embodiment, on the other hand, a stripe direction is parallelized to an a-axis, and hence a waveguide is parallel to the a-axis. The a-axis is parallel to a c-plane, whereby stacking faults formed parallelly to the c-plane do not intersect with the waveguide. Thus, disturbance of a light guide and increase in a leakage current resulting from stacking faults can be avoided.

Figure 16:
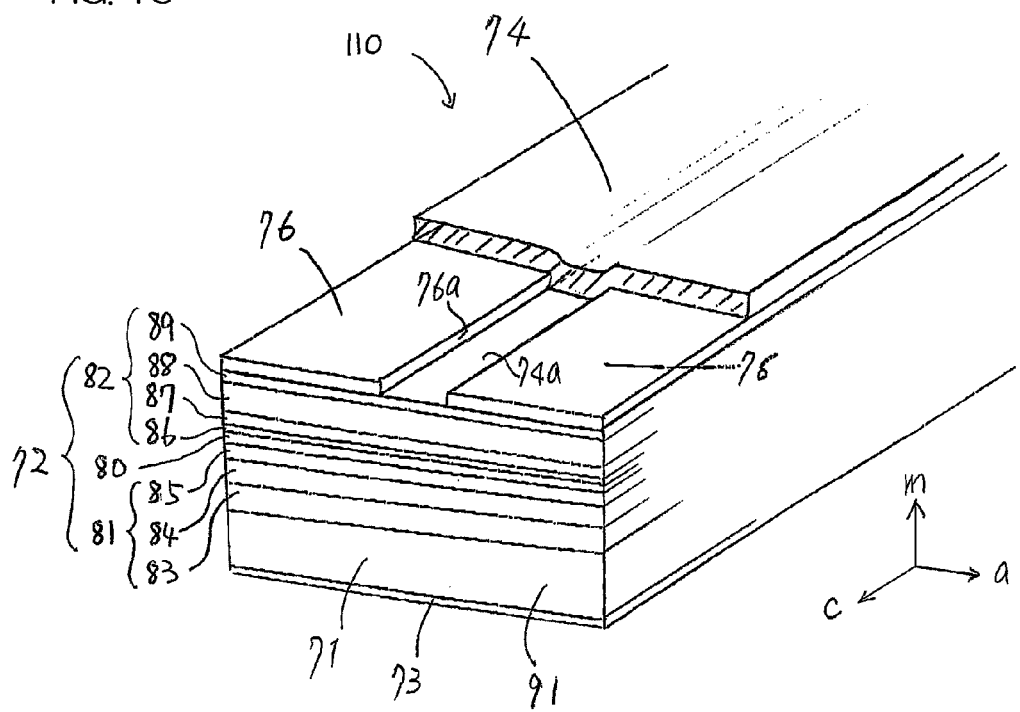
FIG. 16 A schematic perspective view for illustrating the structure of a semiconductor laser diode according to a seventh embodiment of the present invention.

FIG. 16 is a schematic perspective view for illustrating the structure of a semiconductor laser diode according to a seventh embodiment of the present invention. Referring to FIG. 16, portions corresponding to the respective portions shown in the aforementioned FIG. 11 are denoted by the same reference numerals.

In a semiconductor laser diode 110, a planar upper surface of a p-type semiconductor layered portion 72 is covered with an insulating film 76. The insulating film 76 can be constituted of an insulating material such as $SiO_2$ or $ZrO_2$, for example, having a refractive index greater than 1.

The insulating film 76 has a striped (linear) opening 76 along a c-axis direction on a generally central portion in a width direction (a-axis direction). A p-side electrode 74 is formed over regions in the opening 76a and on the insulating film 76, and in contact with the surface (m-plane) of the p-type semiconductor layered portion 82 on a striped contact region 74a in the opening 76a. A pair of cavity end faces 91 (92) are formed perpendicularly to the direction (c-axis direction) of stripes of the striped contact region 74a. A stripe width of the opening 76a (i.e., a stripe width of the contact region 74a) is set to 1 to 100 μm, for example.

According to the structure, current narrowing can be performed by limiting the contact region 74a between the p-side electrode 74 and the p-type semiconductor layered portion 82 in a striped manner with the insulating film 76, whereby laser oscillation can be performed similarly to the case of the fifth embodiment. Besides, the area of the overall p-side electrode 74 is increased, whereby wire connection with an external circuit or the like is easy. Further, the p-side electrode 74 may not be shaped in a striped manner, whereby manufacturing steps are simple and excellent in mass productivity.

In order to manufacture the semiconductor laser diode 110, a group III nitride semiconductor multilayer structure 72 is grown on a wafer, and the insulating film 76 is thereafter formed on the surface of the wafer (more correctly, the surface of the group III nitride semiconductor multilayer structure 72). The insulating film 76 is formed through a lift-off step, for example. In other words, the insulating film 76 having the striped opening 76a can be formed by forming a striped mask, thereafter forming an insulator thin film to cover the overall wafer and thereafter lifting off the insulator thin film for exposing a p-type GaN contact layer 89.

Figure 17:
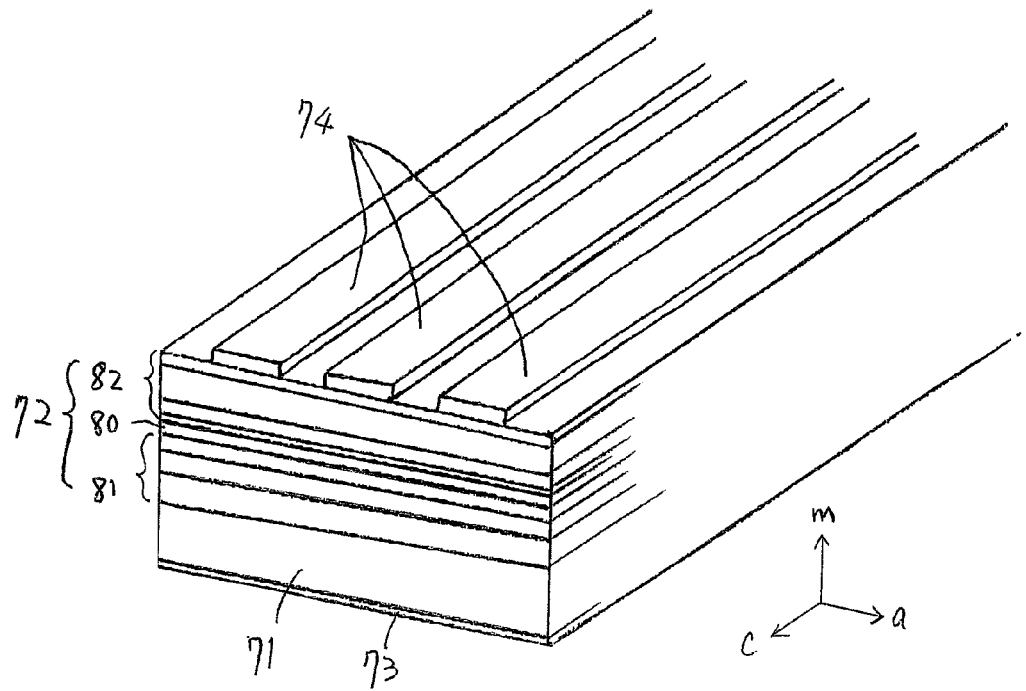
FIG. 17 A schematic perspective view for illustrating the structure of a semiconductor laser diode according to an eighth embodiment of the present invention.

While the seven embodiments of the present invention have been described, the present invention may be embodied in other ways. As shown in FIG. 17, for example, a plurality of striped p-side electrodes 74 separated from one another in an a-axis direction may be parallelly formed along a c-axis direction on a planar upper surface (m-plane) of a p-type semiconductor layered portion 82, so that laser oscillation can be simultaneously or individually caused on the portions of the striped p-side electrodes 74.

Figure 18:
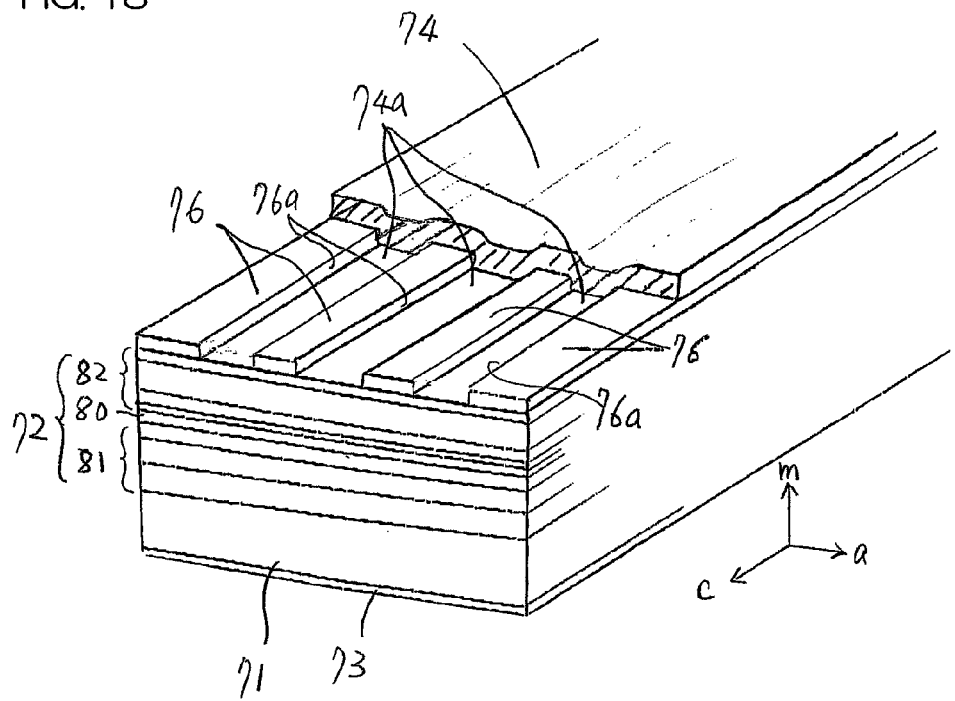
FIG. 18 A schematic perspective view for illustrating the structure of a semiconductor laser diode according to a ninth embodiment of the present invention.

As shown in FIG. 18, a similar modification is possible also as to the embodiment shown in FIG. 16, and a plurality of striped openings 76a separated from one another in an a-axis direction may be parallelly formed along a c-axis direction on an insulating film 76. Thus, it follows that a p-side electrode 74 is in contact with a p-side semiconductor layered portion 82 on a plurality of striped contact regions 74a, and laser oscillation can be simultaneously caused on the portion of each contact region 74a.

In each of the structures shown in FIGS. 16 to 18, the direction of the striped structure (the direction of the contact region 74a) can be taken as in the sixth embodiment (FIG. 14).

Further, the thicknesses of and the impurity concentrations in the layers constituting the group III nitride semiconductor multilayer structure 72 are merely examples, and appropriate values can be properly selected and employed. In addition, the cladding layers 84 and 88 may not be single layers of AlGaN, but the cladding layers can also be constituted of superlattices constituted of AlGaN sensitive layers and GaN layers.

The substrate 71 may be removed by laser lift off or the like after the group III nitride semiconductor multilayer structure 72 is formed, so that the semiconductor laser diode has no substrate 71.

While the anode electrode 3 as the transparent electrode is constituted of an Ni/Au film in the aforementioned embodiment of the light-emitting diode, a transparent electrode consisting of a metal oxide film of ZnO or ITO may be applied to the anode electrode 3.

While GaN semiconductors are employed as the group III nitride semiconductors in the aforementioned embodiments, the present invention can be similarly applied to a light-emitting device employing group III nitride semiconductors expressed as $Al_xIn_yGa_{1-x-y}N$.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-268709 filed with the Japanese Patent Office on Sep. 29, 2006 and Japanese Patent Application No. 2007-40073 filed with the Japanese Patent Office on Feb. 20, 2007, the disclosures of which are incorporated herein by reference.

The invention claimed is:

1. A light-emitting device comprising a group III nitride semiconductor layer of a multilayer structure consisting of a group III nitride semiconductor having a major surface defined by a nonpolar plane or a semipolar plane and having at least an n-type layer and a p-type layer, the light-emitting device further comprising:
   an electrode is provided on the surface of the group III nitride semiconductor layer, wherein the electrode is a p-side electrode; and
   a light output in a c-axis direction is not less than five times a light output in an a-axis direction as to light outputs of a light emitting layer from the nonpolar plane or the semipolar plane,
   wherein the light-emitting device is a laser diode having a pair of end faces parallel to a c-plane,
   wherein the major surface of the group III nitride semiconductor layer is defined by an m-plane, and
   wherein a major growth surface of the light emitting layer is defined by the m-plane, and polarization of light is stronger in the a-axis direction than in other directions.

2. The light-emitting device according to claim 1, wherein the electrode is in the form of stripes.

3. The light-emitting device according to claim 1, wherein the electrode is in the form of stripes along the c-axis direction.

4. The light-emitting device according to claim 1, wherein the end faces are defined by cleavage planes.

5. The light-emitting device according to claim 1, having an insulating film between the electrode and the group III nitride semiconductor layer.

6. The light-emitting diode according to claim 1, wherein the p-side electrode has not less than two contact regions to the group III nitride semiconductor layer.

7. The light-emitting diode according to claim 1, wherein one of the pair of end faces, which is a +c-axis-side end face, is covered with a single first film, and the other of the pair of end faces, which is a −c-axis-side end face, is covered with a multiple film formed by alternately repetitively stacking the first film and a second film.

8. The light-emitting diode according to claim 7,
   wherein the single first film has a thickness of $\lambda/2n_1$, wherein $\lambda$ represents emission wavelength of the light emitting layer, and $n_1$ represents a refractive index of the first film,
   wherein, in the multiple film, each of the first film has a thickness of $\lambda/4n_1$, and each of the second film has a thickness of $\lambda/4n_2$, where $n_2$ represents a refractive index of the second film.

9. The light-emitting diode according to claim 7, wherein the first film is made of $ZrO_2$, and the second film is made of $SiO_2$.

* * * * *